United States Patent [19]
Smith et al.

[11] Patent Number: 5,978,085
[45] Date of Patent: *Nov. 2, 1999

[54] APPARATUS METHOD OF MEASUREMENT AND METHOD OF DATA ANALYSIS FOR CORRECTION OF OPTICAL SYSTEM

[75] Inventors: Adlai H. Smith; Bruce B. McArthur, both of San Diego; Robert O. Hunter, Jr., Rancho Santa Fe, all of Calif.

[73] Assignee: Litel Instruments, San Diego, Calif.

[*] Notice: This patent is subject to a terminal disclaimer.

[21] Appl. No.: 08/956,377

[22] Filed: Oct. 23, 1997

Related U.S. Application Data

[63] Continuation-in-part of application No. 08/813,742, Mar. 7, 1997, Pat. No. 5,828,455.

[51] Int. Cl.$^6$ .................................................. G01B 9/02
[52] U.S. Cl. ............................................ 356/354; 356/124
[58] Field of Search .................................. 356/354, 345, 356/353, 355, 124

[56] References Cited

U.S. PATENT DOCUMENTS

| | | |
|---|---|---|
| 4,861,148 | 8/1989 | Sato et al. . |
| 5,136,413 | 8/1992 | MacDonald et al. . |
| 5,285,236 | 2/1994 | Jain . |
| 5,386,319 | 1/1995 | Whitney . |
| 5,392,119 | 2/1995 | McArthur et al. . |
| 5,501,925 | 3/1996 | Smith et al. . |
| 5,509,553 | 4/1996 | Hunter, Jr. et al. . |
| 5,514,618 | 5/1996 | Hunter, Jr. et al. . |
| 5,538,817 | 7/1996 | Smith et al. . |
| 5,640,233 | 6/1997 | McArthur et al. . |
| 5,828,455 | 10/1998 | Smith et al. ............................ 356/354 |

OTHER PUBLICATIONS

"Accuracy of Overlay Measurements: Tool and Mark Asymmetry Effects," A. Starikov, et al., Optical Engineering, Jun. 1992, vol. 31, No. 6, pp. 1298–1309.

"Binary Optics Technology: The Theory and Design of Multi–Level Diffractive Optical Elements," Swanson, G.J. (Group 52), Technical Report 854, Aug. 14, 1989.

"Wave–front Reconstruction for Compensated Imaging," Hudgin, R., J.Opt.Soc.Am., vol. 67, No. 3, Mar. 1977, pp. 375–378.

"Optimal Wave–front Estimation," Hudgin, R., J.Opt.Soc.Am., vol. 67, No. 3, Mar. 1977, pp. 378–382.

(List continued on next page.)

*Primary Examiner*—Samuel A. Turner
*Attorney, Agent, or Firm*—Townsend and Townsend and Crew LLP

[57] ABSTRACT

A reticle consisting of a multiplicity of small openings corresponding to separate and distinguishable points is put in the reticle plane. This reticle is imaged down through an opening O in aperture plate AP. A corresponding multiplicity of spots are created at the image plane of the optical system. These spots have spot centroids relative to the original separate and distinguishable points in the reticle. These points, however, are deviated from their diffraction limited positions by the average of grad$\phi$(u)) over the corresponding ray bundle. The opening O in the aperture plate samples a discrete portion of the entrance pupil. With points spread out over an area of size 2*NAo*za, ray bundles with chief rays covering the entire entrance pupil will be projected down to image plane IP. The above outlined procedure is extended to analyzing the wavefront at a multiplicity of field points over the entire lens train. The process includes using an aperture plate AP consisting of a multiplicity of openings O. Each opening O is centered underneath a neighborhood of points that is accepted into the entrance pupil of the imaging objective. Points passing through all openings O will produce in the wafer plane a number of spot arrays corresponding to the number of openings O. The totality of all the arrays of spots whose centroids can be measured and reconstructed yield an aberrated wavefront $\phi(u;x)$ at a number of discrete field points x.

19 Claims, 18 Drawing Sheets

OTHER PUBLICATIONS

"Least–Squares Phase Estimation from the Phase Difference," Takajo, H. and Takahashi, T., J.Opt.Soc.Am., vol. 5, No. 3, Mar. 1988, pp. 416–425.

"Least–Squares Wave Front Errors of Minimum Norm," Herrmann, J., J.Opt.Soc.Am., vol. 70, No. 1, Jan. 1980, pp. 28–32.

"Least–Square Fitting a Wave–Front Distortion Estimate to an Array of Phase–Difference Measurements," Fried, D., J.Opt.Soc.Am., vol. 67, No. 3, Mar. 1977, pp. 370–375.

"Noniterative Method for Obtaining the Exact Solution for the Normal Equation in Least–Squares Phase Estimation from the Phase Difference," Takajo, H. and Takahashi, T., J.Opt.Soc.Am., vol. 5, No. 11, Nov. 1989, pp. 1818–1827.

"Wave–Front Estimation from Wave–Front Slope Measurements," Southwell, W.H., J.Opt.Soc.Am., vol. 70, No. 8, Aug. 1980, pp. 998–1006.

"Optimal Wave–Front Correction Using Slope Measurements," Wallner, E., J.Opt.Soc.Am., vol. 73, No. 12, Dec. 1983, pp. 1771–1775.

"Hubble Space Telescope Prescription Retrieval," Redding, D. et al., Applied Optics, vol. 32, No. 10, Apr. 1, 1993, pp. 1728–1736.

"Hubble Space Telescope Characterized by Using Phase–Retrieval Algorithms," Fienup, J.R., et al., Applied Optics, vol. 32, No. 10, Apr. 1, 1993, pp. 1747–1767.

"Phase–Retrieval Algorithms for a Complicated Optical System," Fienup, J.R., Applied Optics, vol. 32, No. 10, Apr. 1, 1993, pp. 1737–1746.

"Effects of Higher–Order Aberrations on the Process Window," Gortych, J.E. and Williamson, D., SPIE vol. 1463 Optical/Laser Microlithography IV (1991) pp. 368–381.

"Identifying and Monitoring Effects of Lens Aberrations in Projection Printing," Toh, Kenny and Neureuther, Andrew, SPIE vol. 772 Optical Microlithography VI (1987) pp. 202–209.

"Asymptotic Behavior of the Response Function of Optical Systems," Ogura, I., J.Opt.Soc.Am., vol. 48, No. 8, Aug. 1958, pp. 38–39.

"The Diffraction Theory of Optical Aberrations, Part 1" Nijnoer, B.R.A., 1943 Elsevier Science Publishers, B.V., The Netherlands, pp. 308–314. (Reprinted from Physica, vol. 10, No. 8, Oct. 1943, pp. 679–692).

"The Diffraction Theory of Optical Aberrations, Part 2" Nijnoer, B.R.A., 1947 Elsevier Science Publishers, B.V., The Netherlands, pp. 315–322. (Reprinted from Physica, vol. 13, 1947, pp. 605–620).

"The Diffraction Theory of Optical Aberrations, Part 3" Nienhuis, K. and Nijnoer, B.R.A., 1949 Elsevier Science Publishers, B.V., The Netherlands, pp. 323–332. (Reprinted from Physica, vol. 14, No. 9, Jan. 1949, pp. 590–608).

"Zernike Annular Polynomials for Imaging Systems with Annular Pupils," Mahajan, V., 1981 Optical Society of America, pp. 342–352.

"Wave–Front Interpretation with Zernike Polynomials," Wang, J.Y. and Silva, D.E., 1980 Optical Society of America, pp. 400–408.

"Transfer Function for an Annular Aperture," O'Neill, E., pp. 517–520, Reprinted from the Journal of the Optical Society of America, vol. 46, No. 4, pp. 285–288 (Apr. 1956) and vol. 46, No. 12, pp. 1096 (Dec. 1956).

"In–House characterization Technique for Steppers," Dusa, M. and Nicolau, D., SPIE, vol. 1088 Optical/Laser Microlithography II (1989) pp. 354–363.

"A Simple and Calibratable Method for the Determination of Optimal Focus," Gemmink, J.W., SPIE, vol. 1088 Optical/Laser Microlithography II (1989) pp. 220–230.

"Electrical Methods for Precision Stepper Column Optimization," Zych, L., et al., SPIE, vol. 633 Optical Microlithography V (1986) pp. 98–105.

"Characterization and Setup Techniques for a 5X Stepper," Brunner, T.A. and Stuber, S.M., SPIE vol. 633 Optical Microlithography V (1986) pp. 106–112.

"Astigmatism and Field Curvature from Pin–Bars," Kirk, J., SPIE, vol. 1463 Optical/Laser Microlithography IV (1991) pp. 282–291.

"A Novel High–Resolution Large–Field Scan–And–Repeat Projection Lithography System," Jain, K., SPIE vol. 1463 Optical/Laser Microlithography IV (1991) pp. 666–677.

"Multispot Scanning Exposure System for Excimer Laser Stepper," Yoshitake, Y., et al., SPIE, vol. 1463 Optical/Laser Microlithography IV (1991) pp. 678–687.

"A New Family of 1:1 Catadioptric Broadband Deep UV High NA Lithography Lenses," Yudong, Z., et al., SPIE, vol. 1463 Optical/Laser Microlithography IV (1991) pp. 688–694.

"New I–Line Lens for Half–Micron Lithography," Takahashi, K., et al., SPIE, vol. 1463 Optical/Laser Microlithography IV (1991) pp. 696–708.

"New 0.54 Aperture I–Line Wafer Stepper with Field by Field Leveling Combined with Global Alignment," van den Brink, M.A., et al., SPIE, vol. 1463 Optical/Laser Microlithography IV (1991) pp. 709–724.

"New I–Line and Deep–UV Optical Wafer Steppers," Unger, R. and DiSessa, P., SPIE, vol. 1463 Optical/Laser Microlithography IV (1991) pp. 725–742.

"A Two–Dimensional High–Resolution Stepper Image Monitor," Pfau, A.K., et al., SPIE, vol. 1674 Optical/Laser Microlithography V (1992) pp. 182–192.

"A New Mask Evaluation Tool, the Microlithography Simulation Microscope Aerial Image Measurement System," Budd, R.A., SPIE, vol. 2197, pp. 530–540.

"Quantitative Stepper Metrology Using the Focus Monitor Test Mask," Brunner, T.A., et al., SPIE, vol. 2197, pp. 541–549.

"Analyzing Deep–UV Lens Aberrations Using Aerial Image and Latent Image Metrologies," Raab, E.L., SPIE, vol. 2197, pp. 550–565.

"Scattered Light in Photolithographic Lens," Kirk, J.P., SPIE, vol. 2197, pp. 566–572.

"Application of the Aerial Image Measurement System (AIMS™) to the Analysis of Binary Mask Imaging and Resolution Enhancement Techniques," Martino, R., et al., SPIE, vol. 2197, pp. 573–584.

"Aerial Image Measurements on a Commercial Stepper," Fields, C.H., et al., SPIE, vol. 2197, pp. 585–595.

"Latent Image Metrology for Production Wafer Steppers," Dirksen, P., et al., SPIE, vol. 2440, pp. 701–711.

"In–Situ Optimization of an I–Line Optical Projection Lens," Huang, C., SPIE, vol. 2440, pp. 734–742.

"A Dual–Wavelength Interferometer for Testing Projection Lenses," Freischald, K. and Chunsheng. H., SPIE, vol. 2440, pp. 743–748.

"Hartmann and Other Screen Tests," Ghozeil, I., Optical Shop Testing, Second Edition, Chapter 10 (1992) pp. 367–396.

"Star Tests," Welford, W.T., Optical Shop Testing, Second Edition, Chapter 11 (1992) pp. 397–426.

"Lithographic Lens Testing: Analysis of Measured Aerial Images, Interferometric Data and Photoresist Measurements," Flagello, Donis and Geh, Bernd, SPIE, vol. 2726, pp. 788–798.

"Aberration Analysis in Aerial Images Formed by Lithographic Lenses," Freitag, W., Applied Optics, vol. 31, No. 13, May 1992, pp. 2284–2290.

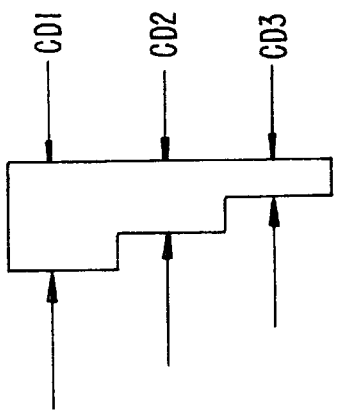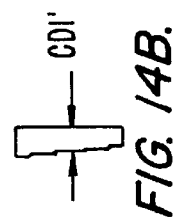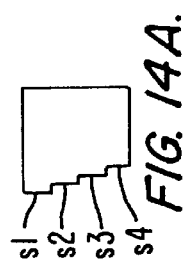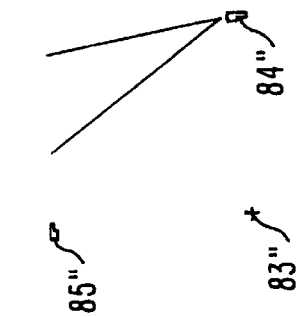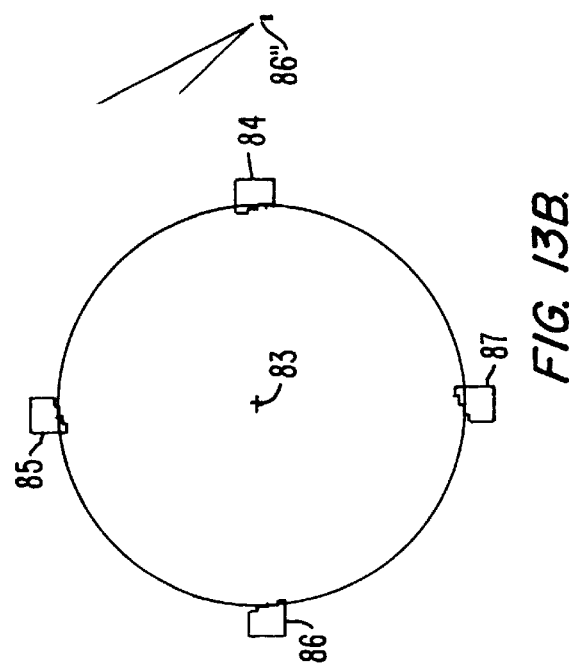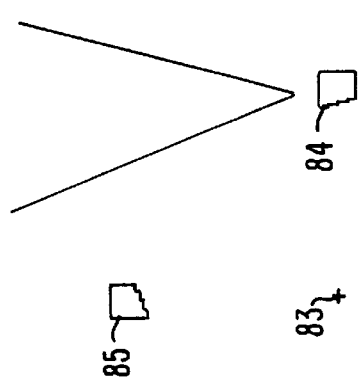

APPARATUS METHOD OF MEASUREMENT AND METHOD OF DATA ANALYSIS FOR CORRECTION OF OPTICAL SYSTEM

This application is a Continuation-In-Part of application Ser. No. 08/813,742, filed Mar. 7, 1997, entitled "Apparatus, Method of Measurement, and Method of Data Analysis for Correction of Optical System", now U.S. Pat. No. 5,828,455.

An apparatus, method of measurement and method of data analysis is described for determining the state of correction of an optical projection system. It produces interferometric measurements of an imaging objective that are taken in-situ and without any significant alteration of the optical or mechanical setup. As such, it can be used to monitor and assess the wavefront at a plurality of field points with only brief interruptions of the optical tool's productive time. The invention or it's modifications as described can be used with photolithographic step and repeat reduction or non reducing imaging systems (steppers), scanning imaging systems, fixed field step and repeat ablation systems, scanning ablation systems, or any other projection imaging or ablation system having large numbers of field points.

In this Continuation-In-Part Patent Application, we set forth an in-situ interferometer attachment for a stepper which can quickly (~minutes of exposure time) generate exit pupil centering and wavefront aberration data on photoresist coated wafers. In the current embodiment, up to 778 field points can be exposed and analyzed. The developed, and possibly etched, wafers are thereafter measured using an optical overlay and critical dimension (CD) tools and the data analyzed by software to yield the Zernike aberration coefficients herein described.

BACKGROUND OF THE INVENTION

Methods of improving the performance of existing and future steppers have a large impact on the economics of microchip and flat panel display production. The ability to improve projection imaging systems through minimally intrusive retrofitting has been done using the techniques of McArthur et al. U.S. Patent entitled Plate Correction of Imaging Systems U.S. Pat. No. 5,392,119 issued Feb. 21, 1995; McArthur et al U.S. patent application entitled Improved Plate Correction Technique for Imaging Systems, Ser. No. 08/592,703 filed Jan. 26, 962; McArthur et al U.S. Patent Application entitled Single Plate Corrector for Stepper Lens Train filed concurrently herewith; and MacDonald et al U.S. Patent Application entitled Imaging and Illumination System with Aspherization and Aberration Correction by Phase Steps now U.S. Pat. No. 5,136,413 issued Aug. 4, 1992.

A key part of retrofitting projection imaging systems is quickly and reproducibly monitoring their state of optical correction. In the above references, distortion and field curvature data from exposed images are interferred and used to design figured optical surfaces that are placed between the top lens and the reticle plane. Distortion and field curvature correspond the lowest order aberrations of an imaging system, namely field dependent tilt and focus. Methods for their in-situ measurement are described in M. Dusa, D. Nicolau, In-house Characterization Technique for Steppers published in Optical/Laser Microlithography II (1989) SPIE Vol. 1088, p. 354. 1989; and D. Flagello, B. Geh entitled Lithographic Lens Testing: Analysis of Measured Aerial Images, Interferometric Data and Photoresist Measurements, SPIE Vol. 2726, p. 788 of Jun. 19, 1990.

In order to ascertain the degree of correction and method of correction for higher order aberrations, more data is necessary than distortion and field curvature.

The application of a conventional interferometer to a projection imaging system can provide high quality wavefront data(see also W. Freitag, W. Grossmann, U. Grunewald entitled Aberration Analysis in Aerial Images formed by Lithographic Lenses, Applied Optics, Vol. 31, No. 13, p. 2284, May 1, 1992).

However, conventional interferometers require removing or significantly altering or disturbing the lens column. The act of removing the lens column could well introduce uncertainties into the measurement and require significant downtime from productive operation. Therefore, in the prior art we find in-situ techniques for determining, distortion, field curvature, best focus, astigmatism, and the aerial image (M. Dusa, D. Nicolau, In-house Characterization Technique for Steppers, Optical/Laser Microlithography II (1989) SPIE Vol. 1088, p. 354 1989; L. Zych, G. Spadini, T. Hasan, B. Arden entitled Electrical Methods for Precision Stepper Column Optimization, Optical Microlithography V (1986), SPIE Vol. 663, p. 98, 1986; T. Brunner, S. Stuber entitled Characterization and Setup Techniques for a 5x Stepper Optical/Laser Microlithography V (1986), SPIE Vol. 663, p. 106 1986; J. Kirk entitled Astigmatism and Field Curvature from Pin-Bars, Optical/Laser Microlithography IV, SPIE Vol. 1463, p. 282, Mar. 6, 1991, A. Pfau, R. Hsu, W. Oldham entitled A Two-Dimensional High-Resolution Stepper Image Monitor, Optical/Laser Microlithography V, SPIE Vol. 1674, p. 182, Mar. 11, 1992; E. Raab, C. Pierrat, C. Fields, R. Kostelak, W. Oldham, S. Vaidya entitled Analyzing the Deep-UV Lens Aberrations Using Aerial Image and Latent Image Metrologies, Optical/Laser Microlithography VII, SPIE Vol. 2197, p 550, Mar. 2, 1994; C. Fields, W. Partlo, W. Oldham entitled Aerial Image Measurements on a Commercial Stepper, Optical/Laser Microlithography VII, SPIE Vol. 2197, p. 585, Mar. 2, 1994; C. Huang entitled In-situ Optimization of an i-line Optical Projection Lens, Optical/Laser Microlithography VIII, SPIE Vol. 2440, p. 735, Feb. 22, 1995).

The greatest amount of information is provided by in-situ aerial image measurements. However the light level is generally low leading to long exposure times or poor signal to noise ratios. The reconstruction of the aberrated wavefront is ambiguous unless several out of focus exposures are done (see D. Redding, P. Dumont, J. Yu, Hubble Space Telescope Prescription Retrieval, Applied Optics, Vol. 32, No. 10, p. 1728, Apr. 1, 1993; J. Fienup, J. Marron, T. Schulz, J. Seldin, Hubble Space Telescope Characterized by Using Phase-Retrieval Algorithms, Applied Optics, Vol. 32, No. 10, p. 1747, Apr. 1, 1993; J. Fineup entitled Phase-Retrieval Algorithms for a Complicated Optical System, Applied Optics, Vol. 32, No. 10, p. 1737, Apr. 1, 1993).

The ideal solution would minimize the intrusion, preserve the lens column and stepper environment, and be quick to perform. It could be utilized to rapidly characterize multiple steppers, as well as perform temporal, barometric, thermal and other environmental characterizations. The device should be a stand-alone, portable unit, that would determine wavefront as a function of imaging field position for all conceivable aberrations of the stepper.

The data generated using such an in-situ wavefront interferometer can be used to help determine opportunities for lens correction. In addition, the output could be utilized in commercially available software programs such as PROLITH and used for photolithography process modeling.

SUMMARY OF THE INVENTION

A reticle consisting of a multiplicity of small openings corresponding to separate and distinguishable points is put in the reticle plane. This reticle is imaged down through an opening O in aperture plate AP. A corresponding multiplicity of spots are created at the image plane of the optical system. These spots have spot centroids relative to the original separate and distinguishable points in the reticle. These points, however, are deviated from their diffraction limited positions by the average of grad$\phi$(u)) over the corresponding ray bundle. The opening O in the aperture plate samples a discrete portion of the entrance pupil. With points spread out over an area of size 2*NAo*za, ray bundles with chief rays covering the entire entrance pupil will be projected down to image plane IP. Here, NAo is the numerical aperture of the imaging objective on the object side or equivalently, the numerical aperture of the entrance pupil, and za is the separation between the aperture plate plane and the reticle plane.

Measuring the deviations of the centroids from their ideal position, we then have average values of grad$\phi$ (u)) sampled over the entrance pupil. Once this measurement of deviations is made, it is possible to reconstruct the aberrated wavefront corresponding to a neighborhood of points in the reticle plane that passed through the opening O in the aperture plate. Assuming that the aberrated wavefront is isoplanatic over this small neighborhood of points, we can identify the reconstructed wavefront $\phi$ (u) with a single field point position (x,y). (x,y) is just the average value of the transverse positions of the neighborhood of openings in the reticle.

The above outlined procedure is extended to analyzing the wavefront at a multiplicity of field points over the entire lens train. The process includes using an aperture plate AP consisting of a multiplicity of openings O. Each opening O is centered underneath a neighborhood of points that is accepted into the entrance pupil of the imaging objective. Points passing through all openings O will produce in the wafer plane a number of spot arrays corresponding to the number of openings O. The totality of all the arrays of spots whose centroids can be measured and reconstructed yield an aberrated wavefront $\phi$(u;x) at a number of discrete field points x.

SUMMARY OF THE CONTINUING INVENTION

An in situ interferometer is disclosed for insertion to the reticle plane of a stepper. The interferometer includes first reticle areas for printing reference squares, second areas for printing exit pupil centering marks, and third areas for printing grid lines; projected grid line offsets from projected reference squares constitute the basic aberration measurement. Regular projection of the stepper occurs by stepping and printing an array of measurement squares onto a photosensitive surface at the wafer plane of the stepper. Exit pupil centering is measured by projection of light through second reticle areas and underlying pin hole apertures effecting printing of a square within square aperture image. The third reticle areas consist of streets and alleys as illustrated by FIG. 4 that are projected through openings or pinholes in the aperture plate (71, FIG. 9A). The projected image made on the die will be distorted in transverse position according to the ray bundle as obscured by the subpupil defined by opening 71 in the aperture plate. The streets and alleys as projected about the square array on the wafer surface form a series of squares within squares that are conveniently measured by conventional optical overlay tools. The automatic or computer operation of the stepper to exercise the in situ interferometer is shown in logic diagram format (FIG. 12a). There results an in situ interferometer which can be programmably operated at assigned intervals during regular operation to produce exposed images which can be automatically read to render high order optical measurement such as distortion, astigmatism, curvature of field, comma, spherical aberration and other aberration modes.

BRIEF DESCRIPTION OF THE DRAWINGS

FIG. 13A is an alternative reticle pattern for determining exit pupil centration.

FIG. 13B is superposes the exit pupil location on the pattern of FIG. 13A.

FIG. 13C is the printed wafer pattern corresponding to the structures and exit pupil offset illustrated in FIG. 13B.

FIG. 14A is a close-up of the step structures on the reticle of FIG. 13A.

FIG. 14B and 14C are blowups of the features to be measured with a CD tool for determining exit pupil centering.

DESCRIPTION OF THE PREFERRED EMBODIMENT

Outline of the General Theory

In a perfect optical system, a point source located in the object or reticle plane of the system sends a diverging or expanding spherical wavefront towards the imaging objective, which then converts it into a converging or contracting spherical wave with center of curvature located in the image or wafer plane. This converging spherical wave then focuses down to a diffraction limited spot; a spot whose size is determined by the wavelength of light and the numerical aperture (NA) of the converging wavefront. In practice, the converging wavefront is not a perfect sphere but deviates from it, and the resulting spot in the image plane is larger than a diffraction limited one.

Figure 2:
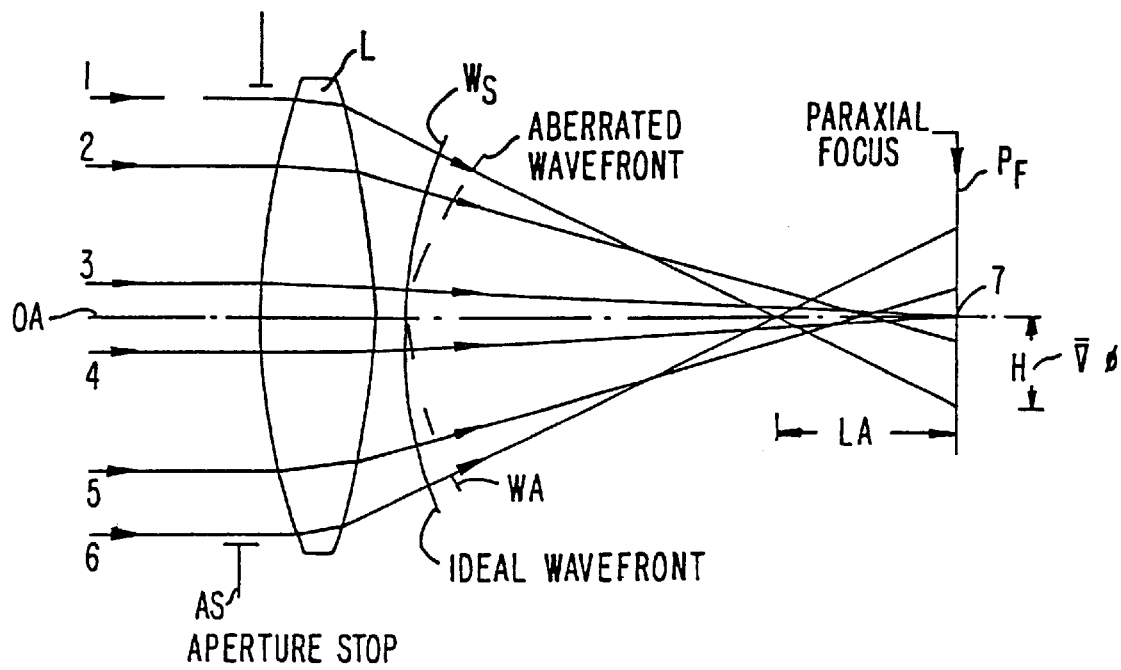
FIG. 2 illustrates a ray bundle suffering from spherical aberration.

FIG. 2 illustrates converging lens L, which is part of an larger, undrawn imaging system. Rays from a point in the object plane (not shown) pass through aperture stop AS, lens L and are never confluent upon a single image point as they pass beyond lens L. Edge rays 1–6, focus distance LA from the paraxial focal plane and spread out to radius H at the paraxial focal plane $P_F$. The best focal plane is located at the plane with the smallest blur circle. Ray trajectories corresponding to ideal spherical wavefront $W_s$ would focus at point 7. The present aberrated wavefront $W_A$ deviates from this sphere. The ray trajectories are normal to the wavefront surface.

Displacement or radius H is proportional to the gradient of the aberrated wavefront $\phi(u)$, or H~ grad$\phi(u)$), where u is the position or angle of the ray at the aperture stop AS and grad is the 2-dimensional gradient operator. Thus, measuring the vector displacements (dx,dy) of a selection of rays, 1,1', 2,2', 3,3', . . . , gives us the derivatives or gradient of the wavefront $\phi(u)$. Given the wavefront gradients, or wavefront gradients averaged over regions of the aperture stop, there are a number of techniques for reconstructing the wavefront or the Zernikie or polynomial moments of the wavefront. These techniques first involve formulating the wavefront reconstruction as overdetermied set of linear equations. Next, these equations are solved using mathematical techniques such as, normal equation solution, damped least squares, or singular value decomposition. References discussing both formulation and solution of the problem include R. Hudgin entitled Wave-front Reconstruction for Compensated Imaging, Journal of the Optical Society of America, Vol. 67, No. 3, p. 375, March 1977; R. Hudgin entitled Optimal Wave-Front Estimation, Journal of the Optical Society of America, Vol. 67, No. 3, p. 378, March 1977; H. Takajo, T. Takahashi entitled Least-Squares Phase Estimation from the Phase Difference, Journal of the Optical Society of America, Vol. 5, No. 3, p. 416, March 1988; J. Herrmann Least-Squares Wave Front Errors of Minimum Norm, Journal of the Optical Society of America, Vol. 70, No. 1, p. 28, January 1980; D. Fried entitled Least-Square Fitting a Wave-Front Distortion Estimate to an Array of Phase-Difference Measurements, Journal of the Optical Society of America, Vol. 67, No. 3, p. 370, March 1977; H. Takajo, T. Takahashi entitled Noniterative Method for Obtaining the Exact Solution for the Normal Equation in Least-Squares Phase Estimation from the Phase Difference, Journal of the Optical Society of America, Vol. 5, No. 11, p. 1818, November 1988; W. H. Southwell entitled Wave-Front Estimation from Wave-Front Slope Measurements, Journal of the Optical Society of America, Vol. 70, No. 8, p. 998, August 1980; E. P. Wallner entitled Optimal Wave-Front Correction Using Slope Measurements, Journal of the Optical Society of America, Vol. 73, No. 12, p. 1771, December 1983.

Therefore if the displacements, H, can be measured, a wavefront reconstruction will yield the aberrated wavefront $\phi(u)$.

Figure 3:
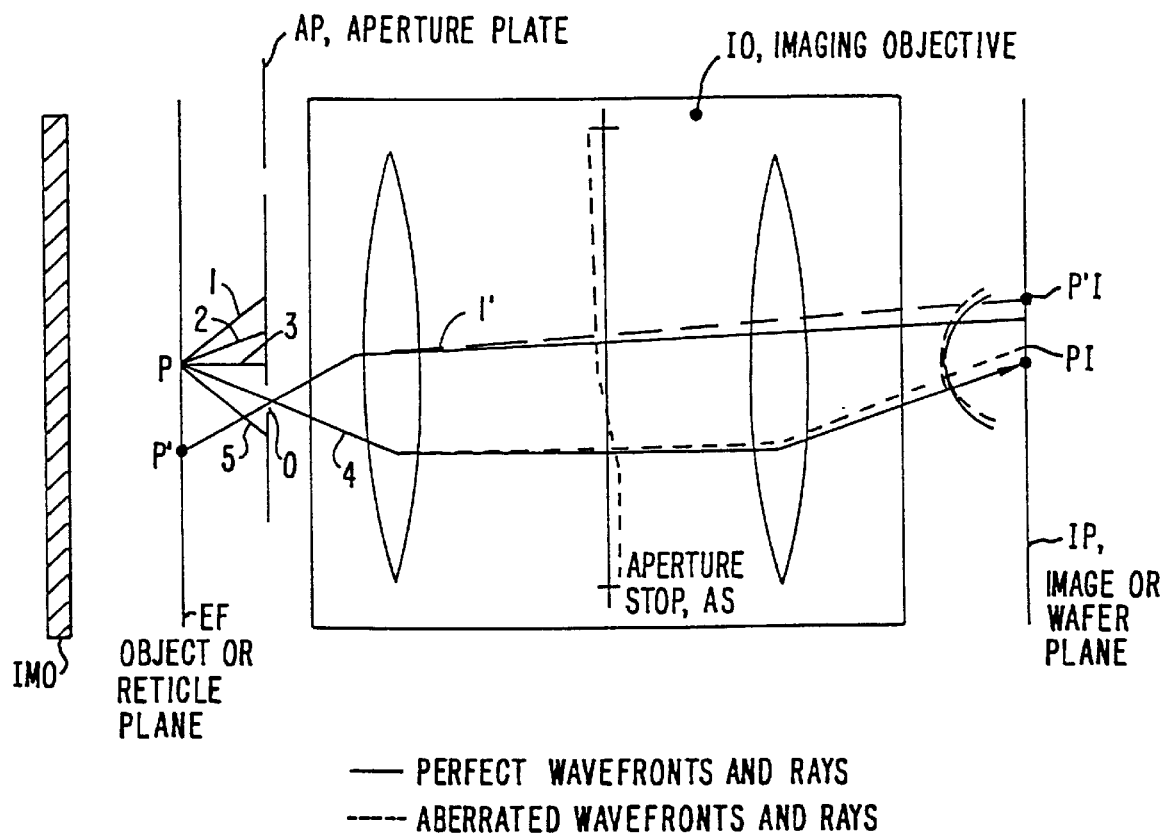
FIG. 3 outlines the functioning of this invention.

FIG. 3 schematically illustrates how information about the displacements H~ grad($\phi(u)$) are obtainable. Point P in the reticle plane has aperture plate AP interposed between it and the first element of the optical system. Of the rays 1, 2, 3, 4, 5 emitted from P, only ray 4 passes through opening O in aperture plate AP and is transmitted by imaging objective IO and projected onto a wafer in image plane IP. Aberrations of imaging objective IO cause ray 4 to deviate from path an unaberrated image objective IO would produce (drawn as a solid line), follow a different path (dashed line), and intersect the wafer at transverse position PI differing from the ideal one by an amount proportional to grad($\phi(u)$). Nearby point P' has only a small bundle of rays centered on ray 1' passing through aperture O in aperture plate AP, through imaging objective IO, and intersects wafer in image plane IP at point QI. The deviation of ray 1' from it's ideal imaging point is also proportional to grad($\phi(u')$), u' being the angle or position of ray 1' as it passes through the aperture stop AS (see solid line (unaberrated) and broken line (aberrated).

In FIG. 2, all of the incident rays 1,2,3,4,5,6 arise from the same object point and there is no aperture plate present, so the projected image consists of a single, diffuse smear that when developed on photoresist consists provides only some information as to the average size of the magnitude of grad($\phi(u)$). In FIG. 3, the ray bundle centered on ray 1 and passing through O creates a spot in plane IP whose centroid is deviated from it's ideal position by the average value of grad($\phi(u)$) for this ray bundle. The ray bundle centered on ray 1' and passing through O similarly creates a spot in plane IP whose centroid is deviated from it's ideal position by the average value of grad($\phi(u)$) for this ray bundle. For sufficiently separated points P, P" their corresponding projected spots PI, P' I are separated by virtue of originating from separate and distinguishable points P, P" in the reticle plane.

Now if instead of just two points, a reticle consisting of a multiplicity of small openings corresponding to separate and distinguishable points is put in the reticle plane and imaged down through opening O in aperture plate AP, a corresponding multiplicity of spots are created whose spot centroids are deviated from their positions by the average of grad($\phi(u)$) over the corresponding ray bundle. With points spread out over an area of size 2*NAo*za, ray bundles with chief rays covering the entire entrance pupil will be projected down to image plane IP. Here, NAo is the numerical aperture of the imaging objective on the object side or equivalently, the numerical aperture of the entrance pupil, and za is the separation between the aperture plate plane and the reticle plane.

Measuring the deviations of the centroids from their ideal position, we then have average values of grad($\phi(u)$) sampled over the entrance pupil and can reconstruct the aberrated wavefront corresponding to a neighborhood of points in the reticle plane. Assuming that the aberrated wavefront is isoplanatic over this small neighborhood of points, we can identify the reconstructed wavefront $\phi(u)$ with a single field point position (x,y). (x,y) is just the average value of the transverse positions of the neighborhood of openings in the reticle.

The above outlined procedure is extended to analyzing the wavefront at a multiplicity of field points. Using an aperture plate AP consisting of a multiplicity of openings such as O, with each opening being centered underneath a neighborhood of points that can are accepted into the entrance pupil of the imaging objective will produce in the wafer plane an array of spots whose centroids can be measured and reconstructed to yield an aberrated wavefront $\phi(u;x)$ at a number of discrete field points x.

Depending on the illumination conditions present at the reticle plane, not all of the acceptance cone of the entrance will be filled. This is compensated for by utilizing an imaging matching optic, IMO, that precedes the reticle plane and alters the incident illumination so that the entire entrance pupil is filled.

Illumination Matching Optic

Figure 1A:
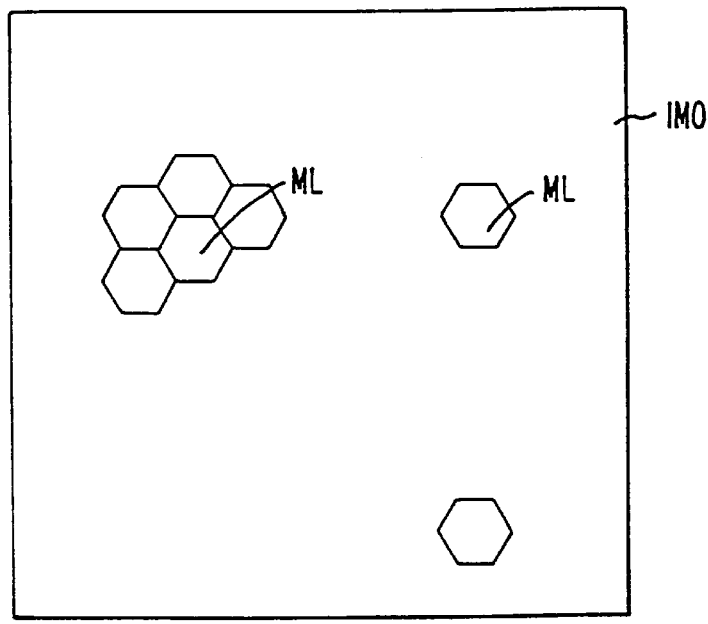
FIGS. 1a, 1b and 1c are the top side and bottom views of the interferometer head.
Figure 1B:
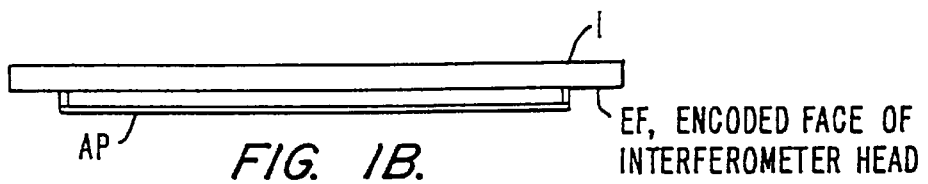
Figure 1C:
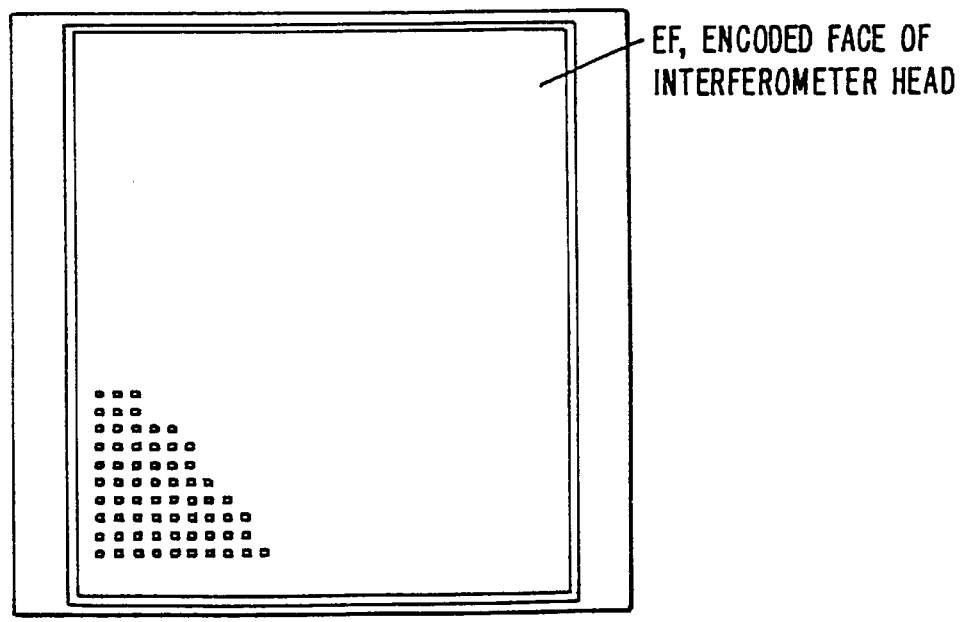

FIGS. 1a, 1b and 1c illustrates the preferred embodiment of the interferometer head in top, side, and bottom views respectively. The top side (FIG. 1a) shows the illumination matching optic, IMO, consisting of an array of hexagonally packed microlenses ML. Their purpose is to increase the diversity of ray angles impinging on the encoded face, EF, so that it is uniform over the imaging objective numerical aperture on the object or reticle side, NAo. A number of arrangements are possible some of which are a diffuser plate with complete or limited scattering range, microlens arrays in square or hexagonal geometries, scattering structures located on the encoded face, or a combination of lens arrays and diffusers to both decrease exposure time and simultaneously achieve angular diversity.

Encoded Face

Figure 4:
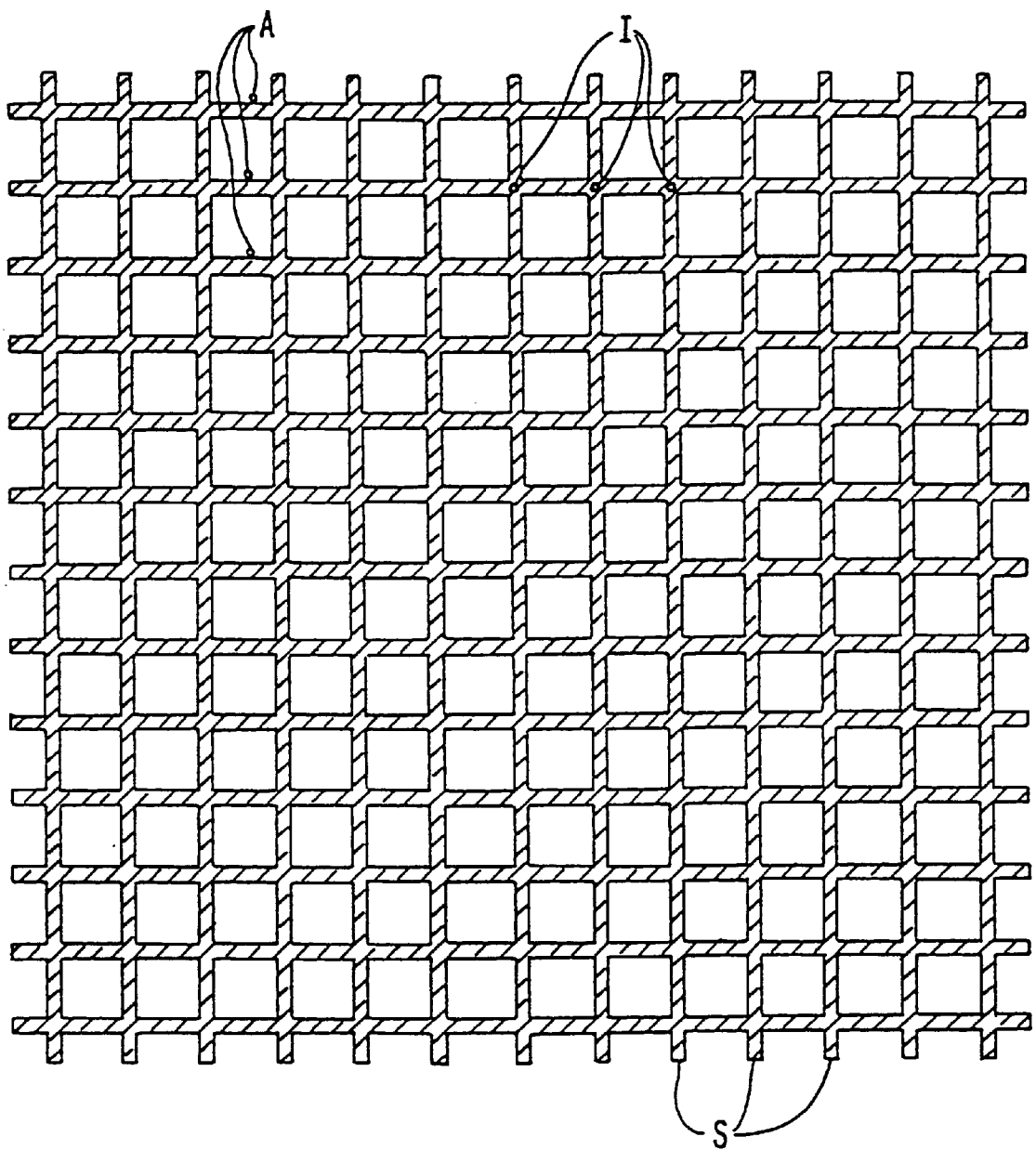
FIG. 4 illustrates an exemplary pattern on the encoded face.

The encoded face EF, consists of a series of patterns, one for each field point, consisting of a regular array of streets and alleys, S and A that define intersections I as shown in FIG. 4. The exact number of field points that can be interrogated will depend on details of the imaging system, but for a typical I-line projection stepper, hundreds to thousands of field points can be interrogated. Thus on an ASM/100 stepper over 500 field points are easily accommodated with greater than 10,000 being possible. This regular array, when projected through an opening O in aperture plate AP is modified in 2 notable ways. First, since the pattern of FIG. 4 has been chosen so that it's angular extent as measured from the center of opening O extent is larger than NAo, the overall projected pattern will have it's extent determined in by the shape and size of the entrance pupil. Thus, for a circular entrance pupil, the overall square pattern of FIG. 4 will be projected down to an overall circular one, FIG. 5, of size=2*za*NAo/M, the missing corners and edges being blocked at the system aperture stop AS. Thus a circularly obscured entrance pupil would produce a similarly circularly obscured pattern at the wafer plane.

For a typical I-line projection system such as the ASM/100 we would have:
za=encoded face to aperture plate distance=5 mm
NAo=numerical aperture on the object side=0.11
M=imaging reduction ratio=5
size of projected pattern=2*za*NAo/M=0.22 mm
P=pitch between adjacent projected patterns=1 mm There is one set of waffle iron patterns for each field point we are measuring.

The second way is in their deviation in accordance the wavefront aberration. The intersections, I, of the streets and alleys on the encoded face, EF, are precisely made in a regular array or if imprecisely made will have had their positions precisely measured so that in either case their positions on EF are precisely known. Intersections I upon being projected onto the wafer plane through the aperture plate and imaging objective form a corresponding array of intersections I'. The deviation of these spots is related to the wavefront gradients as follows:

$$(d\ x, d\ y) = \frac{\lambda}{2\pi NA} * \frac{\int d^2 n W(n) * \nabla(\phi(n))}{\int d^2 n W(n)} \quad (1)$$

l=wavelength of light
NA=numerical aperture on the image side
n=vector indicating relative ray position at aperture stop
W(n)=1 over the portion of the aperture stop ray bundle passed through
=0 otherwise.

In the preferred embodiment, the encoded face consists of an array of gridlike or street and alley openings with one set of openings for each interrogated field point. This choice is mainly dictated by the ability of high precision optical metrology tools such as the Nikon 5I to accurately measure intersections of lines at right angles. Using other tools, different patterns would be more advantageous. Thus for an electron beam based metrology tool or different optical metrology tools, circular or square dots might be better suited for precise measurement. Another pattern, might be streets and alleys that do not intersect but are transversely displaced and measured use separate but nearby openings in aperture plate AP. Yet another pattern might consist of the marks used by a stepper or projection imaging system with accurate location subsystem, it could even be marks used by the very same system under test.

In another version, since the entrance pupil naturally limits the imaging field of view passing through each aperture, the entire encoded face could contain without interruption a suitable pattern, such as dots or grid lines.

In another variation, the function of the illumination matching optic can be incorporated in whole or in part on the encoded face.

The projected pattern could be made in reverse contrast from that shown. It could be manufactured using e-beam lithography, or a photowriter. It can be reproduced using contact printing.

Aperture Plate

The openings in aperture plate AP are typically circular in shape. Their size is determined by the desired resolution of the wavefront reconstruction, smaller sizes corresponding to greater transverse resolution. Their angular size is given by:
tan(NAa)=Ra/za
where the preceding symbols take on the following meanings and typical values:
NAa=half angle subtended by aperture opening=0.01 rad
Ra=radius of opening O in aperture plate=0.05 mm
za=encoded face to aperture plate distance=5 mm.

The transverse resolution determines the number of modes or Zernikie polynomials that can be well determined as: $Nz \sim 0.5*(NAo/NAa)^2=60$ for the exemplary numbers already cited.

Figure 6:
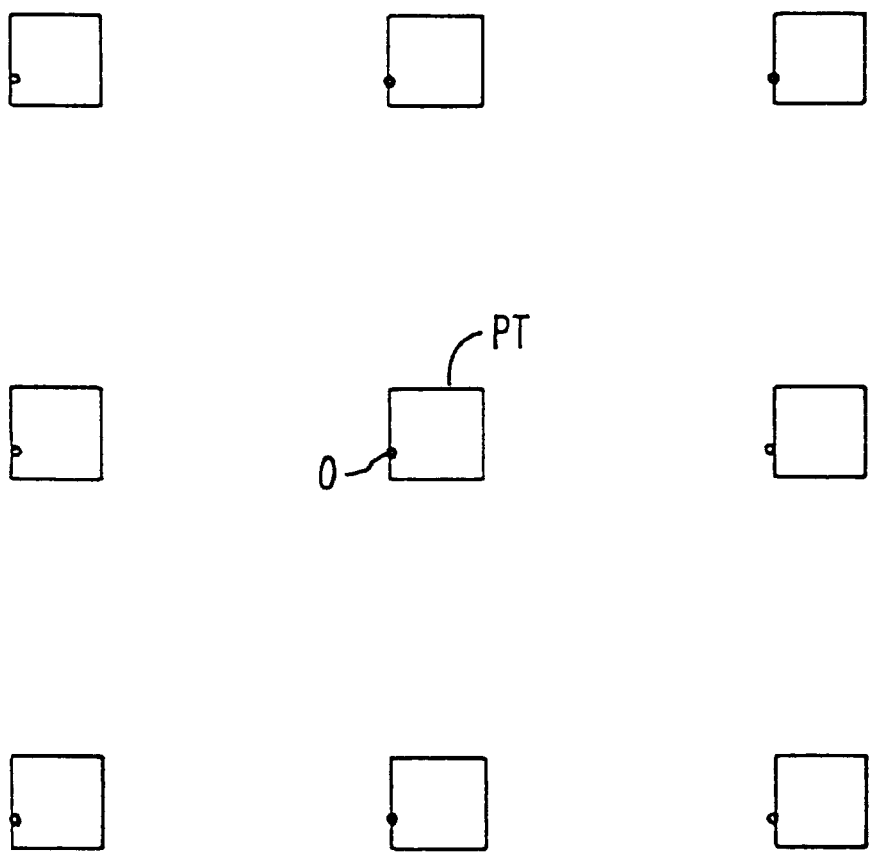
FIG. 6 shows part of the aperture plate and encoded head in plan view.

Referring to FIG. 6, the nominal transverse location of aperture opening O is the center of the chief ray passing through the center of the pattern PT and the center of the aperture stop AS. For an imaging objective telecentric on the object side the transverse centers of PT and O would coincide; FIG. 6 depicts the general, non-telecentric case. To interpret the projected images with maximum accuracy, the relative transverse positions of patterns PT and apertures O must be precisely set or at least known. To this end, apertures O are preferably fabricated with high (<1 mm) accuracy using contact printing, direct write or NC controlled machine tools. Alternatively, the plate could be fabricated and the relative positions measured with sufficient accuracy, these measurements later being used in the aberrated wavefront reconstruction process. Even if the openings in the plate are accurately made, due to variances from stepper to stepper in the nontelecentricity or the exact position of the reticle/aperture plate combination, the chief ray from the center of pattern PT will not always line up with the center of aperture O.

Figure 5:
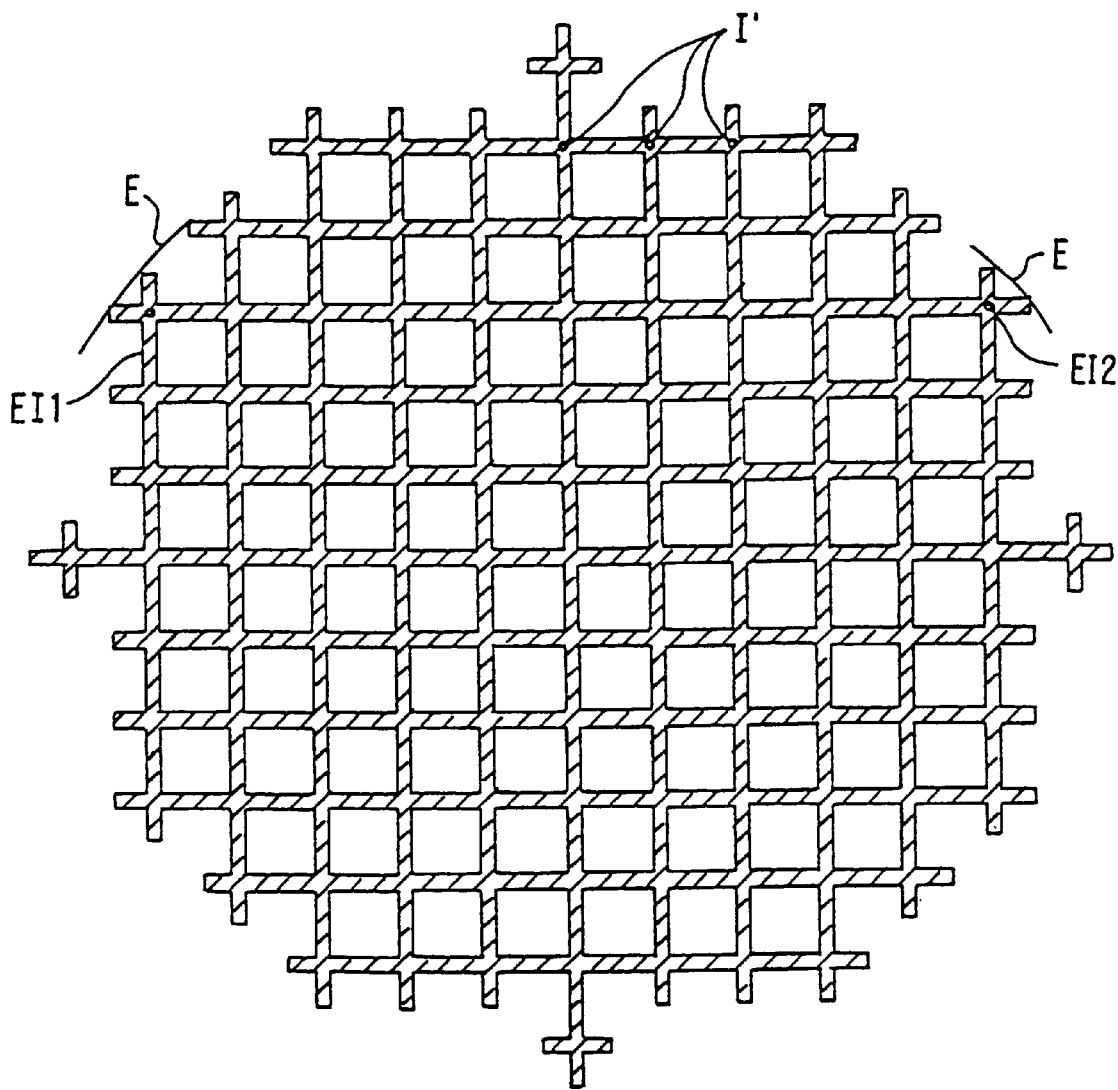
FIG. 5 is a projection onto a wafer of FIG. 4.

There are several methods to ascertain the transverse position of apertures O with respect to the centers of patterns PT. Referring to FIG. 5, the projected pattern is nominally centered on the circle defined by the entrance pupil of the imaging objective. If aperture O were transversely shifted, the edge intersections EI1 and EI2 would be offset by different amounts from projected edge of the entrance pupil, E. Indeed, any set of well defined points in the projected pattern whose position is measured relative to the edge of the projected field can be used to determine the offset of aperture plate AP, from the encoded face EF. Thus, if the openings O in the aperture plate have been made or measured to sufficient tolerance, the overall rotation and offset of the aperture plate relative to encoded face is determined by measuring the offset at 2 field points.

Figure 7:
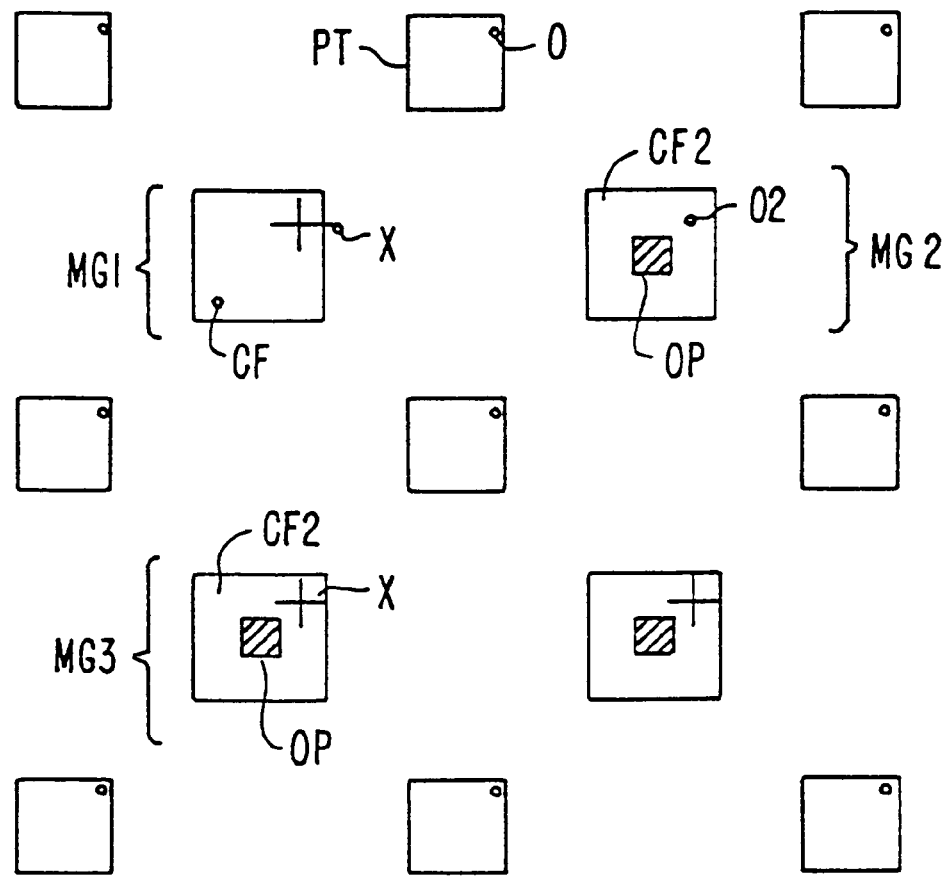
FIG. 7 shows alignment mark structures in plan view.

Alternatively, other sets of marks can be used to determine the transverse offset between aperture plate and encoded face. In FIG. 7, interspersed with the patterns, PT, and openings, O, used for determining the wavefront aberrations are mark groups MG1, MG2 and MG3 that can be used to determine the transverse alignment of the aperture plate and encoded face. Group MG1 consists of a clear field area CF in the encoded face larger than 2*NAo*za and a corresponding cross, X, in the aperture plate. When the cross is suitably sized, what prints in the reticle plane is a square with rounded corners. This mark must be used in conjunction with group MG2.

Group MG2 consists of a clear field area CF2 in the encoded face larger than 2*NAo*za with another opaque square, OP, centered on it. The corresponding feature in the aperture plate is a circular opening O2. What prints in the reticle plane is a square surrounded by a circle. The inner square corresponds to region OP, while the outer circle corresponds to the boundaries of the entrance pupil. Measuring the offset of these two projected features determines the local offset between encoded face and aperture plate. When used in conjunction with group MG1, the offset of the square with rounded corners printed by MG1 and region OP produced by MG2 can be used to determine the local offset between aperture plate and encoded face.

Group MG3 combines features of the previously described groups. It MG3 consists of a clear field area CF2 in the encoded face larger than 2*NAo*za with another opaque square, OP, centered on it. The corresponding feature in the aperture plate is a cross shaped opening, X. What prints in the reticle plane is a square surrounded by another square with rounded corners. The inner square corresponds to region OP, while the outer circle corresponds to the boundaries of the entrance pupil. Measuring the offset of these two projected features determines the local offset between encoded face and aperture plate.

The aperture plate is typically made of thin (<0.3 mm) glass or fused silica and the apertures are either contact printed or directly written on it. The plate is then chemically milled to produce clear, through, openings. Alternatively, the glass plate can be used with openings in it's chrome coated face corresponding to the apertures, but the aberration induced by the additional glass thickness must be subtracted out from the reconstructed result so that the aberrated wavefront represents the imaging objective optical performance and does not contain measurement artifacts. If this is done, the glass thickness of the aperture is preferably measured before assembly and any variations in glass thickness used as inputs for the subtraction procedure.

Once made and characterized, the aperture plate can be contact printed to produce replicas.

Measurement of Spots

The photoexposure is typically made on chrome coated fused silica wafers. After exposure, the plates are developed, the exposed chrome etched, and the remaining photoresist stripped. An optical metrology tool such as the Nikon Instruments 5I is used to locate the positions of the projected patterns and any reticle to plate alignment marks. Alternatively, silicon wafers having a metallic layer such as Cr, Au, or Ni, overcoated with photoresist are photoexposed, developed and the exposed metal etched away. The transverse positions of the projected patterns and alignment marks are then measured with an optical metrology tool capable of working in reflected light or in an e-beam metrology tool. Another method involves measuring the positions of openings in photoresist (no metal etch step). If the accuracy is sufficient for the application, an ordinary coordinate measuring tool could be used for ascertaining the locations of the projected pattern.

Yet another technique involves the projected patterns being alignment marks that are automatically readable by the projection system's own alignment system. This last technique is particularly advantageous if used with alignment systems and photoresist that detect a latent, undeveloped image in photoresist.

Wavefront Reconstruction

The wavefront is specified as a sum of Zernikie polynomials as:

$$\phi(n) = \Sigma a_k * Z_k(n) \qquad (2)$$

where the summation is over the indices, k, $a_k$ is the coefficient of the Zernikie polynomial $Z_k(n)$. Zernikie polynomials and their application to wavefront aberrations are described in B. Nijboer entitled The Diffraction Theory of Optical Aberrations, Part I: General Discussion of the Geometrical Aberrations, Selected Papers on Effects of Aberrations in Optical Imaging, Vol. MS 74, p. 308, 1993; B. Nijboer entitled The Diffraction Theory of Optical Aberrations, Part II: Diffraction Pattern in the Presence of Small Aberrations, Selected Papers on Effects of Aberrations in Optical Imaging, Vol. MS 74, p. 315, 1993; K. Nienhuis, B. Nijboer entitled The Diffraction Theory of Optical Aberrations, Part III: General Fomulae for Small Aberrations: Experimental Verification of the Theoretical Results, Selected Papers on Effects of Aberrations in Optical Imaging, Vol. MS 74, p. 323, 1993; V. Mahajan entitled Zernike Annular Polynomials for Imaging Systems with Annular Pupils, Selected Papers on Effects of Aberrations in Optical Imaging, Vol. MS 74, p. 342, 1993; J. Wang, D. Silva entitled Wave-front Interpretation with Zernike Polynomials, Selected Papers on Effects of Aberrations in Optical Imaging, Vol. MS 74, p. 400, 1993. Then defining $$b_{j,k} = \frac{\int d^2 n W(n) * \nabla(Z_k(n))}{\int d^2 n W(n)} \quad (3)$$

we wish to minimize:

$$E = \Sigma(dx_j - \Sigma a_k * b_{j,n} a_k)^2 \quad (4)$$

where the first sum runs over j and the second over k. $dx_j$ is understood to be the j'th vector measurement. Other methods of formulating the problem as well as solving this class of problem are discussed in references R. Hudgin entitled Wave-front Reconstruction for Compensated Imaging, Journal of the Optical Society of America, Vol. 67, No. 3, p. 375, March 1977; R. Hudgin entitled Optimal Wave-Front Estimation, Journal of the Optical Society of America, Vol. 67, No. 3, p. 378, March 1977; H. Takajo, T. Takahashi entitled Least-Squares Phase Estimation from the Phase Difference, Journal of the Optical Society of America, Vol. 5, No. 3, p. 416, March 1988; J. Herrmann Least-Squares Wave Front Errors of Minimum Norm, Journal of the Optical Society of America, Vol. 70, No. 1, p. 28, January 1980; D. Fried entitled Least-Square Fitting a Wave-Front Distortion Estimate to an Array of Phase-Difference Measurements, Journal of the Optical Society of America, Vol. 67, No. 3, p. 370, March 1977; H. Takajo, T. Takahashi entitled Noniterative Method for Obtaining the Exact Solution for the Normal Equation in Least-Squares Phase Estimation from the Phase Difference, Journal of the Optical Society of America, Vol. 5, No. 11, p. 1818, November 1988; W. H. Southwell entitled Wave-Front Estimation from Wave-Front Slope Measurements, Journal of the Optical Society of America, Vol. 70, No. 8, p. 998, August 1980; E. P. Wallner entitled Optimal Wave-Front Correction Using Slope Measurements, Journal of the Optical Society of America, Vol. 73, No. 12, p. 1771, December 1983. The preferred technique is the singular value decomposition.

Alternative Embodiments

Thus far, this invention has been largely described with reference to a combined imaging matching optic, encoded face and aperture plate that constitute a single contiguous item. The utility of this invention derives from the nonintrusive, accurate, and rapid process for collecting interferometric data. Thus we now briefly describe alternative embodiments that incorporate these essential features but have differing physical arrangements of the key elements.

One arrangement involves segmenting the elements of imaging matching optic, encoded face and aperture plate as separate objects. An advantage of this is that if the imaging system had ready accommodation for these separate attachments, a flexible and widely varying set of exposure and pattern conditions could be produced with the minimal # of discrete parts. Additionally, by segmenting these parts, the aperture plate could be place at other locations in the beamtrain, such as directly above the wafer or at suitable or otherwise convenient locations within the imaging objective itself. The imaging matching optic could be place at a more advantageous location within the stepper illumination subsystem. Indeed, locations for these elements could be incorporated as standard features in stepper systems.

Another arrangement using a moveable aperture plate that shifts along with the wafer after each exposure. The recorded images are then analyzed in a similar manner.

Yet another arrangement utilizes an array of photodetectors and correspond preamplifiers, and memory packaged in to the form factor of a wafer. The wafer is loaded along with the interferometer head and exposed. To increase the sensitivity it the xy stage is dithered.

The use of this interferometer arrangement has been described in reference to it's use in projection photoexposure systems such as those described in T. Sato et al. U.S. Pat. No. 4,861,148 entitled Projection Optical System for Use in Precise Copy; T. Whitney U.S. Pat. No. 5,386,319 entitled High Resolution Imagery Systems and Methods issued Jan. 31, 1995, K. Jain entitled A Novel High-Resolution Large-Field Scan-and-Repeat Projection Lithography System, Optical/Laser Microlithography IV, SPIE Vol. 1463, p. 666, Mar. 6, 1991; Y. Yoshitake, Y. Oshida, T. Tanimoto, M. Tanaka, M. Yoshida, entitled Multispot Scanning Exposure System for Excimer Laser Stepper, Optical/Laser Microlithography IV, SPIE Vol. 1463, p. 678, Mar. 6, 1991; Z. Yudong, Z. Haixing, W. Zhijiang entitled A New Family of 1:1 Catadioptric Broadband Deep UV High NA Lithography Lenses, Optical/Laser Microlithography IV, SPIE Vol. 1463, p. 688, Mar. 6, 1991; K. Takahashi, M. Ohta, T. Kojima, M. Noguchi entitled New I-Line Lens for Half-Micron Lithography, Optical/Laser Microlithography IV, SPIE Vol. 1463, p. 696, Mar. 6, 1991; M. van den Brink, B. Katz, S. Wittekoek entitled New 0.54 Aperture I-line Wafer Stepper with Field by Field Leveling Combined with Global Alignment, Optical/Laser Microlithography IV, SPIE Vol. 1463, p. 709, Mar. 6, 1991, R. Unger, P. DiSessa entitled New I-Line and Deep-UV Optical Wafer Steppers, Optical/Laser Microlithography IV, SPIE Vol. 1463, p. 725, March 6, 1991. Such photoexposure systems can take the form of refractive or catadioptric, fixed field step and repeat systems, slit type scanning systems, or scanning step and repeat systems. However it can equally well be used for other instruments such as projection ablation tools, scanning imaging or ablation systems (U.S. Pat. No. 5,509,553 entitled "Direct etch processes for the manufacture of high density multichip modules" by Bruce McArthur, Robert Hunter and Adlai Smith or U.S. Pat. No. 5,285,236 entitled "Large-area, high-throughput, high-resolution projection imaging system" by Kanti Jain), for cameras, microscopes and most conveniently in any instrument having a readily useable recording plane.

DESCRIPTION OF THE CONTINUATION IN PART PREFERRED EMBODIMENTS

Figure 8:
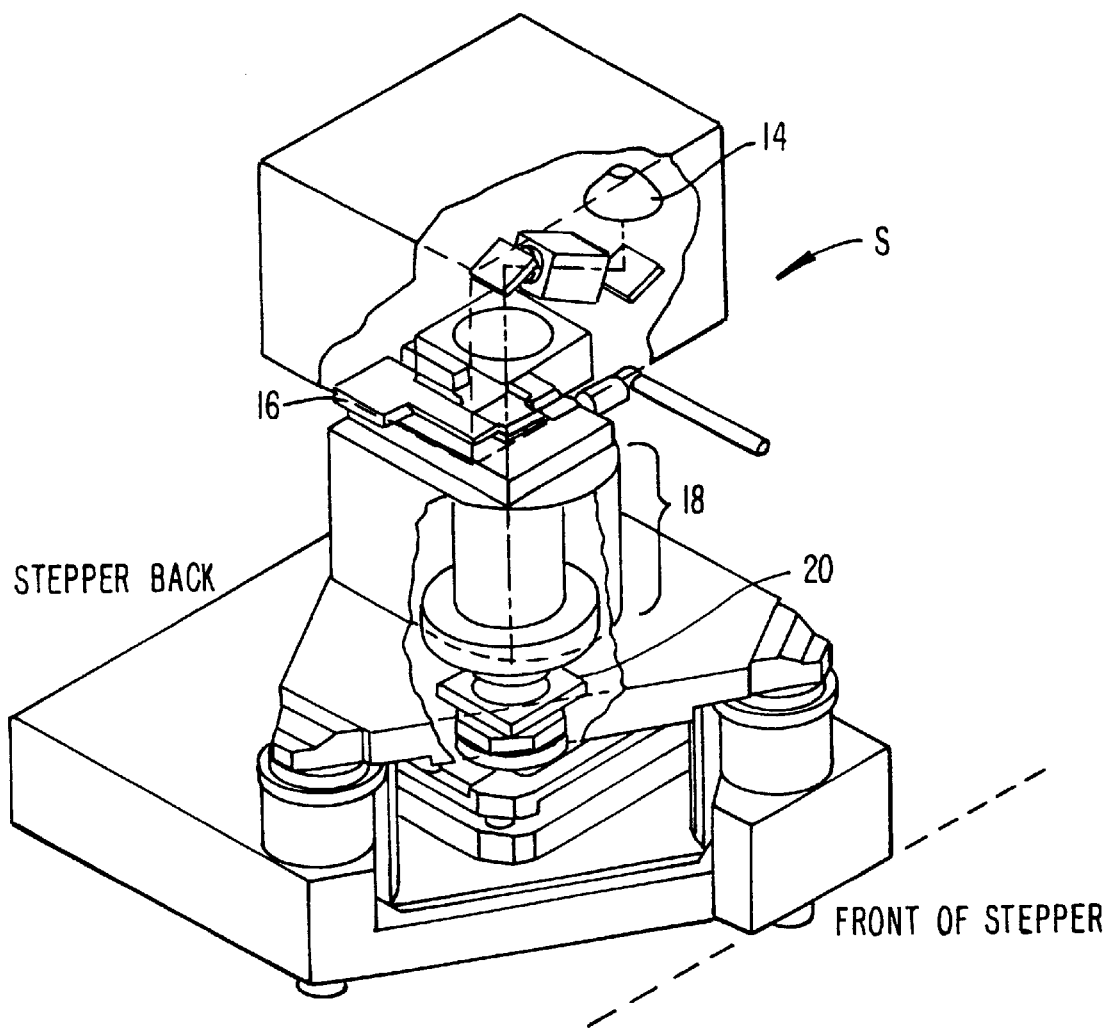
FIG. 8 is the first view of the Continuation in Part Materials and is a side elevation view of a typical stepper illustrating generally the reticle plane, and the wafer plane for development of the interferometer data of this invention.

Referring to FIG. 8, conventional stepper S is illustrated. Conventional stepper S includes reticle plane 16, imaging objective 18, and wafer plane 20. Conventional stepper S can be seen and understood to be an extremely precise optical appliance with many alignments related to its optical parts. This being the case, if any disassembly of this appliance can be avoided during interferometric measurement, it is to be desired.

In the description that follows, it will be seen that this invention includes a simple interferometer head which is inserted to reticle plane 16 of conventional stepper S. Thereafter, by conventional stepper manipulation, the required interferometry measurements occur.

Figure 9A:
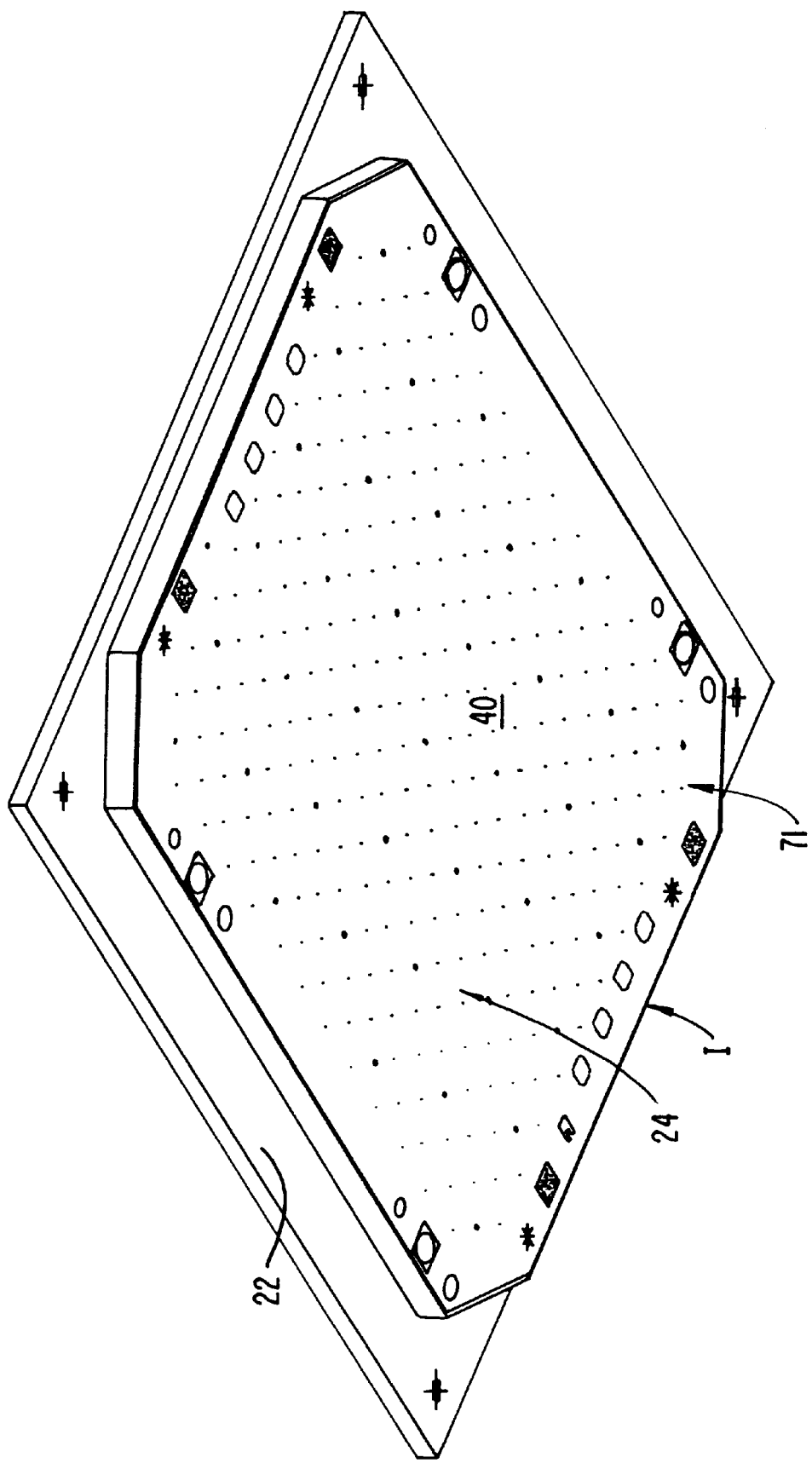
FIG. 9A is a bottom perspective view of an in situ interferometer illustrating the device as it is configured for insertion to the stepper illustrated in FIG. 8.

Referring to FIG. 9A, a bottom perspective view of interferometer head I is illustrated. Head edge 22 is configured to be received at reticle plane 16 of conventional stepper S. It can be seen that interferometer body 24 protrudes below head edge 22. This protrusion is no large than traditional pellicle protection covers afforded many conventional reticles.

Figure 9B:
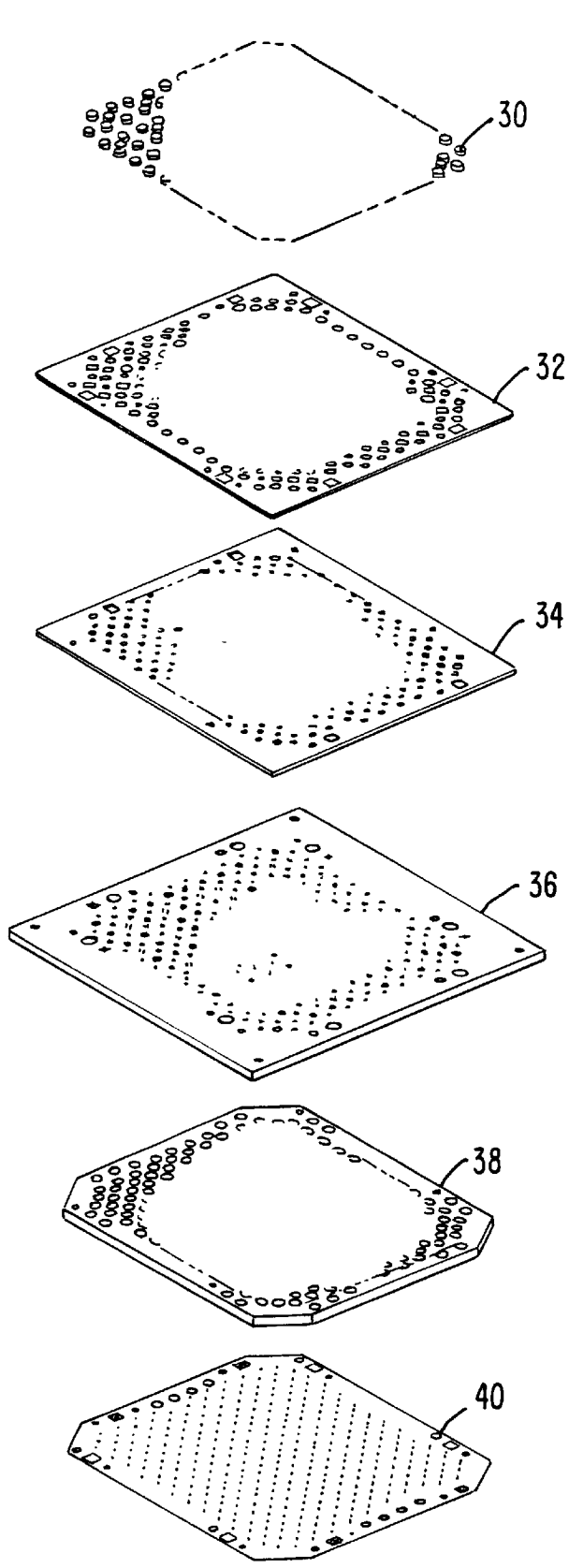
FIG. 9B is an exploded view of the interferometer illustrated in FIG. 9A illustrating the differing layers therein.

Referring to FIG. 9B, an exploded view of interferometer head I is illustrated. Interferometer lens 30 is shown in exploded relation relative to lens frame 32 and diffuser plate 34. When lens frame 32 and diffuser plate 34 are placed in juxtaposition, lens 30 is held in place. The reader will understand that in actual fact, lens 32 and diffuser plate 34 mount many interferometer lenses 30, these lenses each overlying both an aperture.

Lens frame 32 and diffuser plate 34 in turn overlie encoded face 36 of interferometer head I. As will hereafter become more apparent, encoded face 36 contains three principal types of image fields. These image fields are those required for imprinting a regular array of squares (See FIG. 11A), those image fields required to determine exit pupil centering (See FIG. 10A), and finally those image fields required to impart images of "streets and alleys" about the regular array of squares (See FIGS. 4, 11B and 11C).

Lenses, 30, are located above the reticle and with low enough profile so that the resulting structure can be automatically loaded into steppers. This is generally possible since most steppers allow for topside (illumination side) pellicles. These lenses nominally focus at the center of the aperture hole corresponding to a field point (Ma or Mb structure). Fused silica lenses or other suitably transmissive material must be used for deep UV (248 nm or shorter) steppers. For economy of space, the lenses could be diffractive. Other structures above the reticle for improving the quality of the projected structure include but are not limited to, glass beads or particles, deep or shallow 'frosted' or random structures, holographic or diffractive structures, or lenses or other refractive components in addition to random components.

A spatial separation is provided from encoded face 36 and aperture plate 40. Accordingly, stand off plate 40 is provided in this interval. Finally, and at the portion of interferometer head I nearest to wafer plane 20, aperture plate 40 is placed. This aperture plate 40 can be seen in the perspective bottom plan view of FIG. 9A.

Figure 9C:
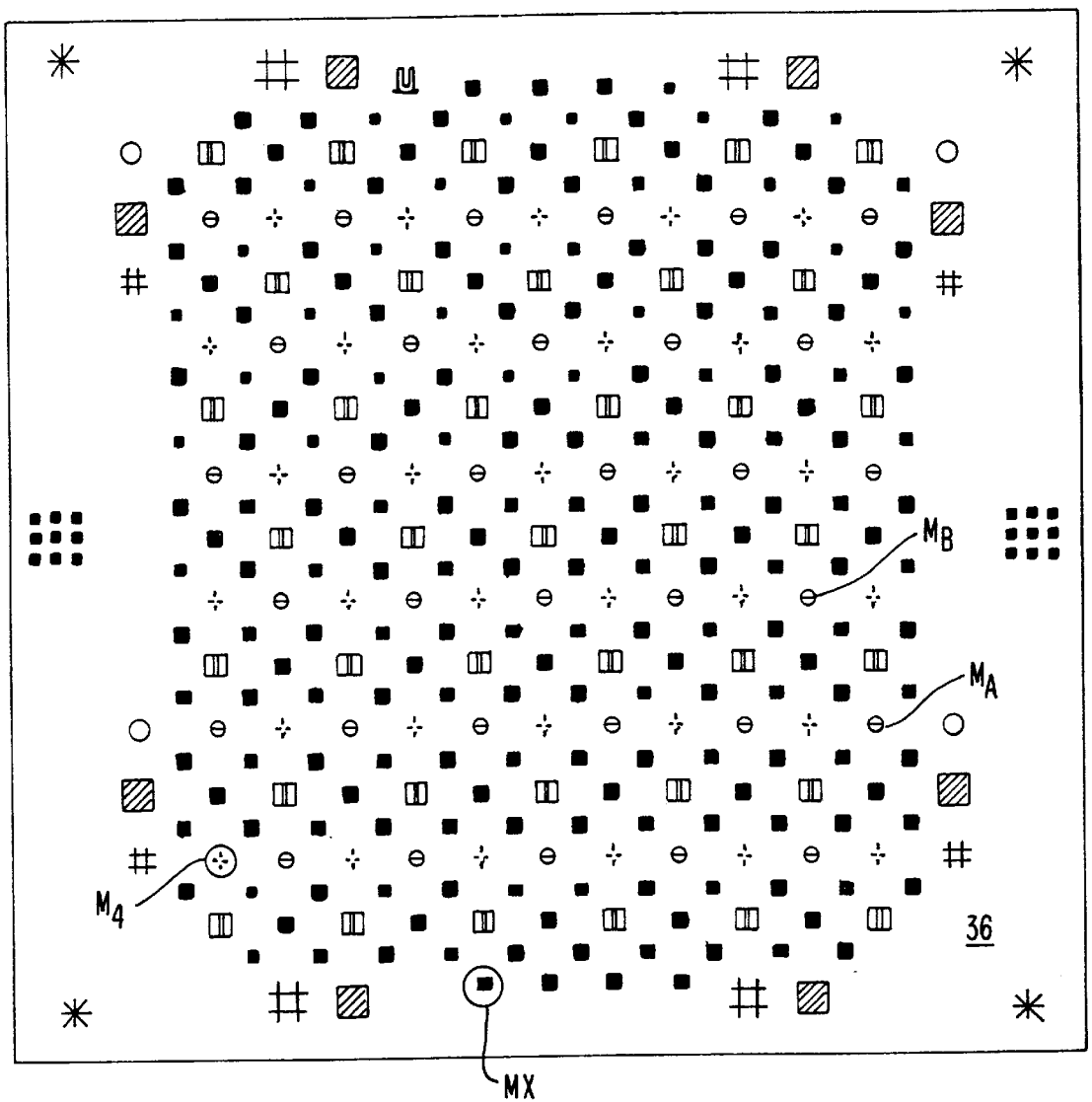
FIG. 9C is an enlarged view of the encoded face of the stepper generally indicating a first areas for determining exit pupil centering, a second area for stepping and printing squares for referencing streets and alleys; and a third area for imposing about the previously printed squares a matrix of "streets and alleys" from which the field point aberrations can be derived.

Referring to FIG. 9C, a schematic representation of encoded face 36 is represented. By way of example, regular square arrays MX, exit pupil centering arrays M4, and street and alley arrays MA and MB are shown. As arrays MA and MB are substantially identical, only one such street and alley array MA will be illustrated.

Figure 11A:
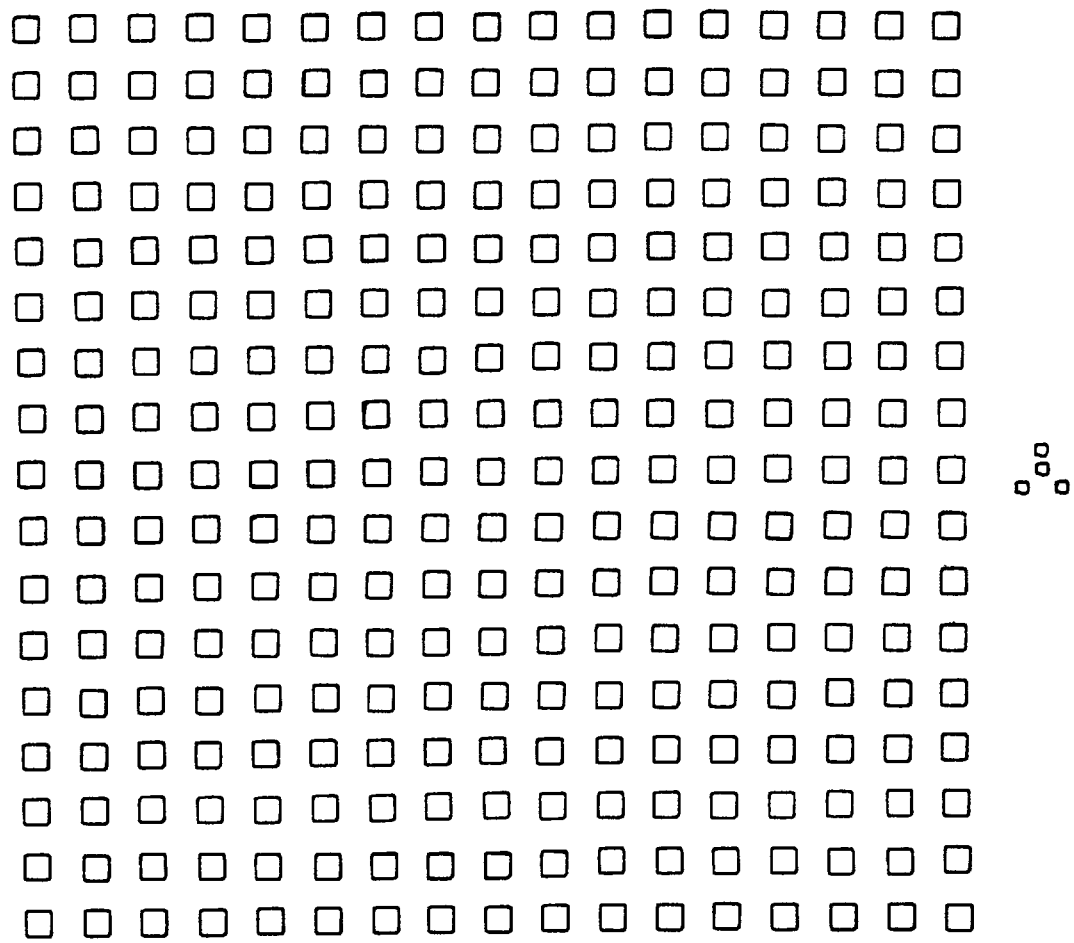
FIG. 11A is an exploded view of the in situ interferometer at the portion of the encoded face for imprinting the reference squares.

When exposing the Mx (or My) structures of FIG. 11a, the opening in the aperture plate so large that it is never a limiting or vignetting aperture as it is in the case of the Ma's or Mb's (streets and alleys).

Figure 10A:
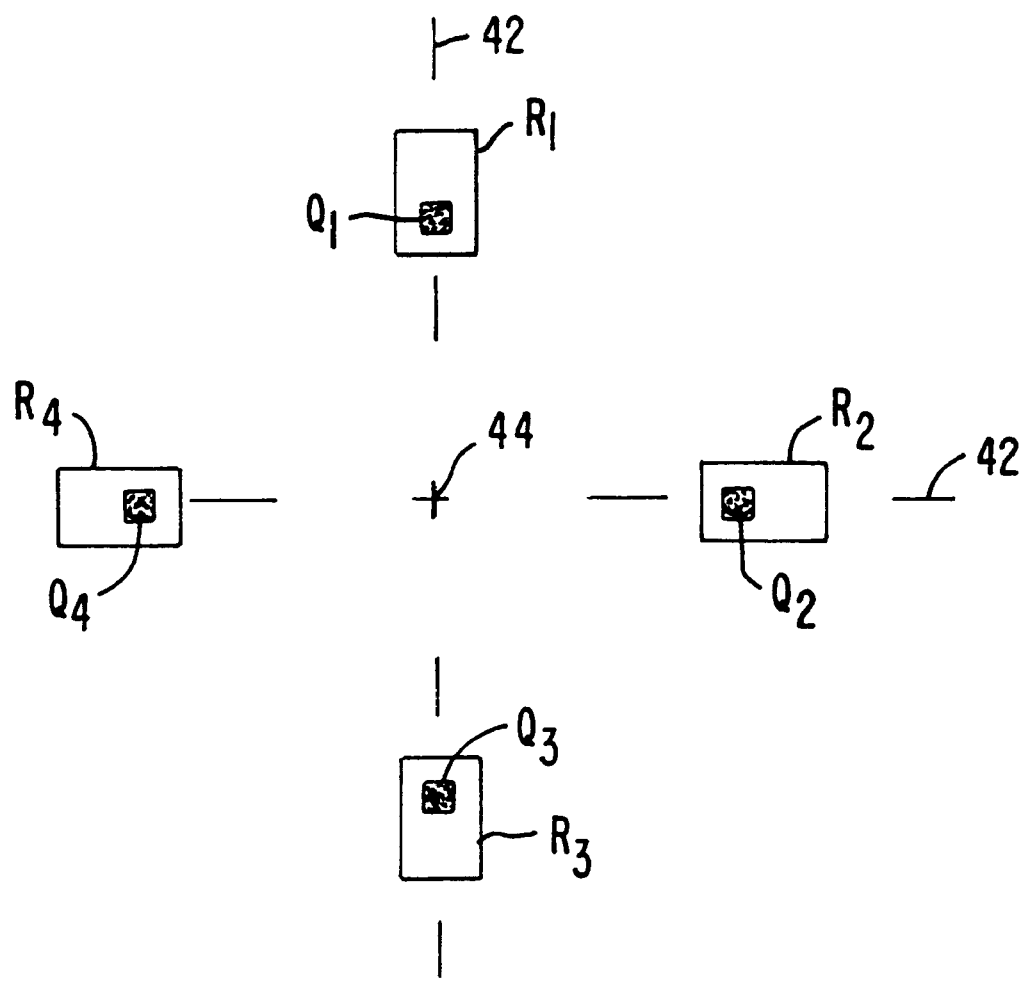
FIG. 10A is a plan view of the in situ interferometer at the encoded face for determining exit pupul centering, it being realized that underlying "pin hole apertures" are not shown.

Referring to FIG. 10A, the pattern for producing exit pupil centering data is illustrated. Specifically, four rectangles R1–R4 are utilized. Each of four rectangles R1–R4 is aligned with its major axis 42 pointing to common central point 44. Each respective rectangle includes offset square Q1–Q4 offset along X or Y major axis 42 to and toward common central point 44. These figures all appear on encoded face 36 at the M4 locations indicated or presumed from their unique signature in FIG. 9C.

On aperture plate 40, and offset from central point 44 there is located an aperture—this aperture being schematically shown on aperture plate 40 in FIG. 9B. The transverse position of the aperture is in line with the trajectory of the chief ray that passes through the center of the stepper exit pupil. Mathematically, transverse position (x, y) of central point 44 is determined by the aperture location and the stepper's non-telecentricity on the wafer side by the following formulas:

$$x = xa/(1 - zap/fch) \quad (5)$$

$$y = ya/(1 - zap/fch) \quad (6)$$

In the above formula the symbols take on the following meanings:

(x, y)=(X, Y) location in the reticle plane of central point 44

(xa, ya)=(X, Y) location in the reticle plane of the center of the aperture hole passing light zap=distance between reticle plane and aperture plane fch=focal length of the chief rays on the reticle side of the stepper.

Figure 10B:
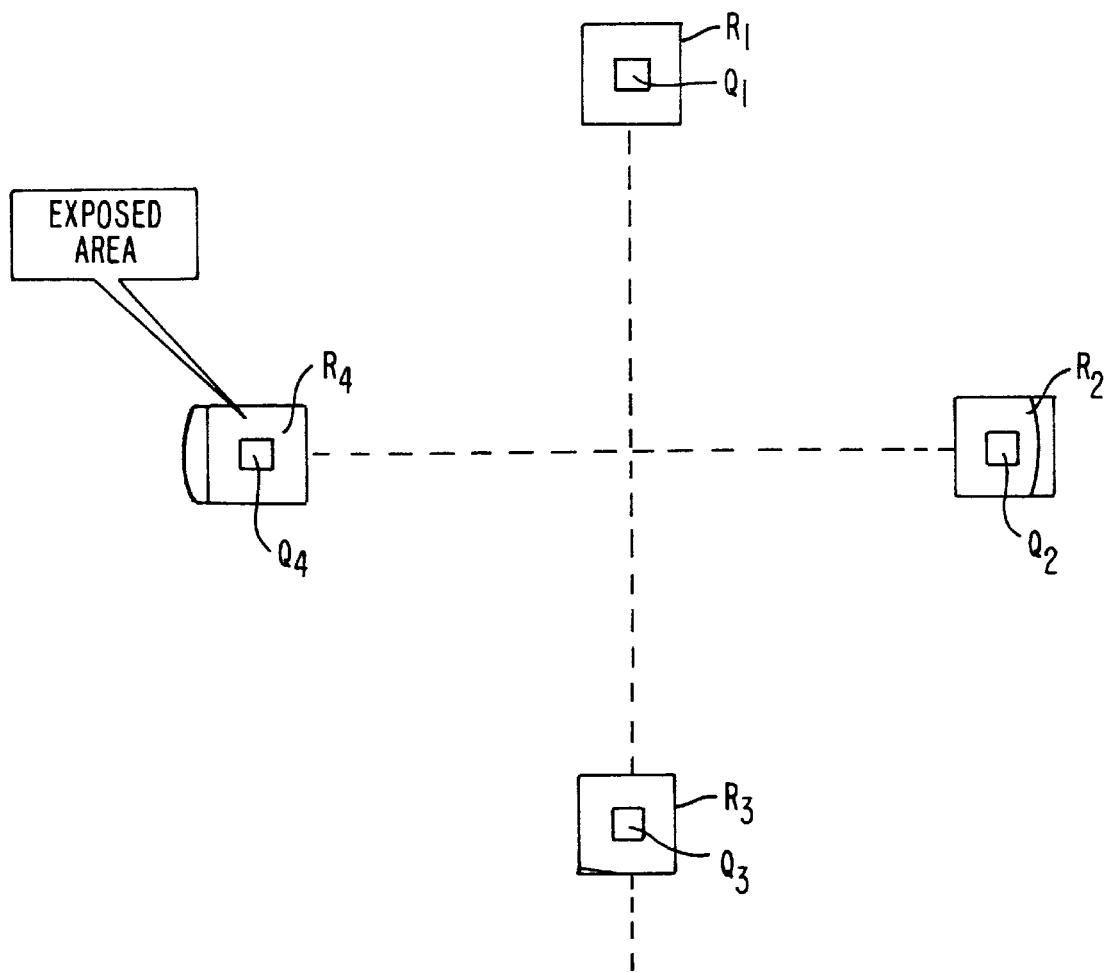
FIG. 10B is a pattern schematic illustrating imprinted square within square patterns illustrating displacement of superimposed squares for indicating the encountered exit pupil centering.

Referring to FIG. 10B, the projection of the pattern of FIG. 10A through the underlying aperture can be seen to wafer plane 20 and to a photoresist covered wafer at that location. Specifically, and where exit pupil centering is perfectly aligned, a regular array—square centered within larger bounding square will be produced. Where exit pupil centering is shifted, the array pattern of FIG. 10B will be present.

Specifically, and with respect to FIG. 10B, exit pupil centering is slanted to the left. It will be seen that upper and lower rectangles R1, R4 have squares Q1, Q3 precisely centered. However, right rectangle R2 is truncated so as to place its square R2 nearer the truncated wall. At the same time, left rectangle R4 is elongated so that its square Q4 extends further from the elongated wall. This telltale pattern appears illustrating exit pupil shift.

It is to be noted that this is a "square within a square" pattern. Presuming that a wafer with this exposure is exposed at wafer plane 20 of conventional stepper S and thereafter developed (and possibly etched) for high contrast, the resultant image will can be read in an automated fashion by an optical overlay tool. Such tools are conventionally utilized by those have ordinary skill in the art operating conventional steppers S. For example, optical overlay tools are made by IVS of Concord, MA and KLA of San Jose, Calif. Models of instruments suited for use with this invention are respectively IVS 100 series and KLA 5000 series, these being Optical Overlay or command Optical Overlay/CD tools.

Utilizing the disclosed patterns, printed to a developed wafer, and reading the results with the above optical overlay tools, automated read out of exit pupil centering can occur.

Referring to FIG. 11A, regular square array MX is illustrated. It is important for the reader to understand that this square array is normally projected from regions MX on encoded face 36 to wafer plane 20 of conventional stepper S. Such generation occurs by so-called step and repeat modes of conventional stepper S. However, regular square array MX can be generated alternatively either by pre-exposing the array on a wafer or alternatively utilizing a separate reticle to print the desired array. The preferred step and repeat exposure shown with respect to FIG. 11A is not required. As drawn in FIG. 11a, the individual squares correspond to openings in an otherwise opaque chrome mask for use with positive photoresist. The contrast would be reverse when using negative resist.

Once regular square array MX is placed at wafer plane 20, then practice of this invention includes projecting a pattern of "streets and alleys" about each of the squares of regular square array MX. Such a projection is shown with respect to FIGS. 11B and in more detail in FIG. 11C.

Figure 11B:
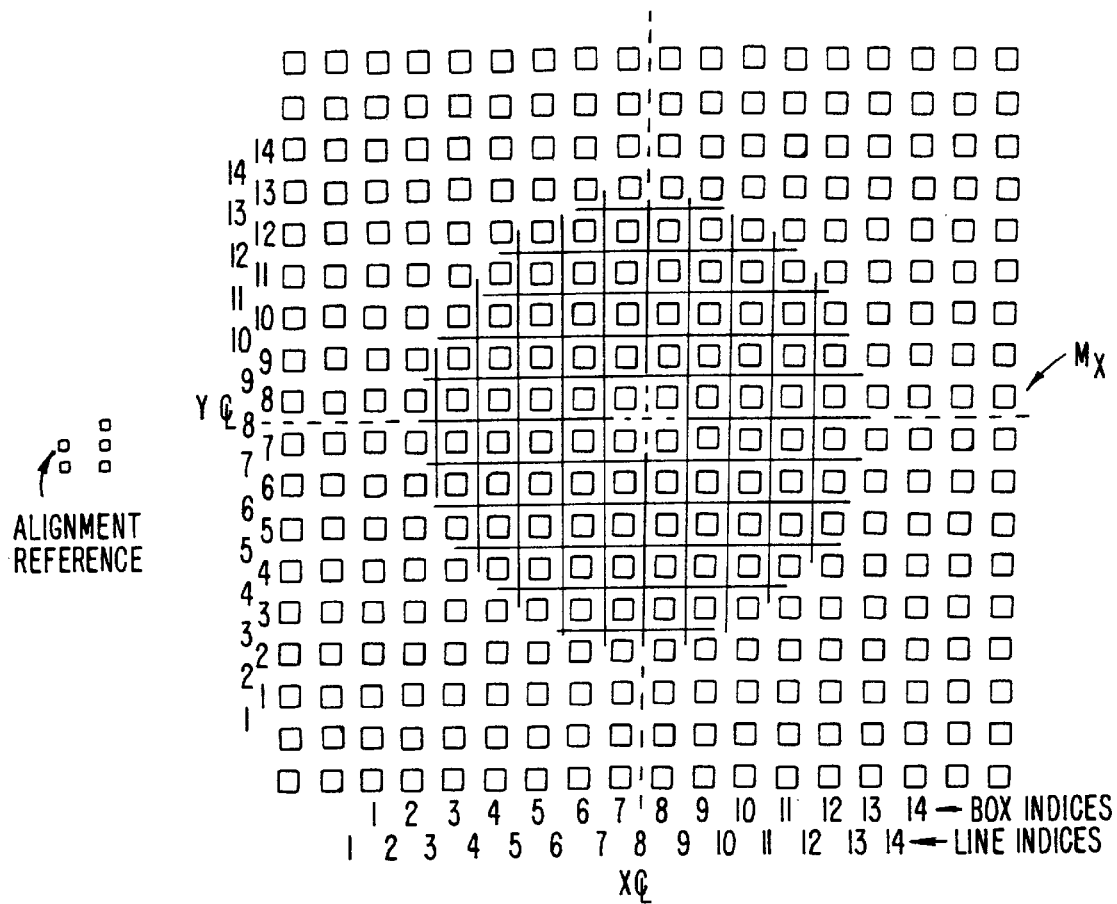
FIG. 11B is an aperture of "streets and alleys" imprinted over the previously printed field of squares illustrated in FIG. 11A.

Referring to FIG. 11B, regular square array MX has street and alley arrays MA projected about its individual squares. Specifically, this occurs at each interferometer lens 30 through street and alley arrays patterns MA appearing at encoded face 36 of interferometer head I. To each street and alley array there corresponds a single lens 30. These street and alley arrays MA thereafter appear about and are developed relative to regular square array MX. Preferably, and in such development, etching occurs to impart to street and alley arrays MA and the bounded regular square array MX a high contrast appearance.

It will be seen that street and alley arrays MA are shown in FIG. 11B having a circular terminator with respect to regular square array MX. It will be understood that since interferometer lens 30 take light from each aperture and cause it to pass through lenses 18 of conventional stepper S, this circular terminator is a function of the aperture stop of conventional stepper S; it does not relate to the particular aperture underlying interferometer lens 30. The effect of an annular aperture stop is illustrated in FIG. 11B.

Figure 11C:
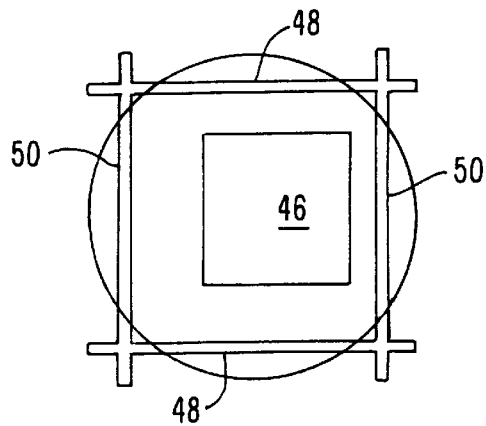
FIG. 11C is an enlarged detail of one of the squares and surrounding "streets and alleys" illustrating the data points which can be extracted by conventional optical overlay and CD tools.

Referring to FIG. 11C, single square 46 is shown bounded by horizontal alleys 48 and vertical streets 50. It can be seen because of optical aberrations, single square 46 is not centrally located relative to horizontal alleys 48 and vertical streets 50. Displacement in the direction of right vertical street 50 has occurred. Likewise, displacement to the top horizontal alley 48 has occurred.

It will be further understood that in the displacements illustrated, a familiar "square within a square" results. Again, the displacements of such arrays easily lend themselves to automated reading by optical overlay tools, these tools being specifically enumerated above, herein.

In the description this far, we show the collection of data from a so-called MB projection. These projections included the nominal projected pupil center at the wafer lying midblock between the streets and alleys.

It is to be understood that additional data points can be taken. This constitutes a shift of the street and alley field. In a so-called MA measurement, the street and alley array has the intersection of street and alleys nominally at the center of the exit pupil.

Further, the reader will understand that shifting by smaller amounts can be made. By making multiple shifts one can get greater precision in optical measurements. For example, by utilizing the mathematical equations previously set forth, the number of data points and consequently the number of Zernikie measurements taken improve the overall precision of measurement. For example, a total of four (4) such offsets may be utilized. Additional techniques for increasing the density of measurement points (and thus the number of distinguishable aberration or Zernike modes) includes using multiple masks with street and alley patterns differentially offset with respect to the exit pupil, rotating a single or multiple masks, and clustering a number of field points near to one another (each with a separate aperture hole) and relying on the relative isoplanatism of the stepper to combine results. If measurements of only lower order modes are desired then, the aperture hole diameter can be increased, thus increasing the bundle averaging and measuring only relatively few (typically 2 times the number of modes or Zernike coefficients desired) box in a box measurements.

Figure 12A:
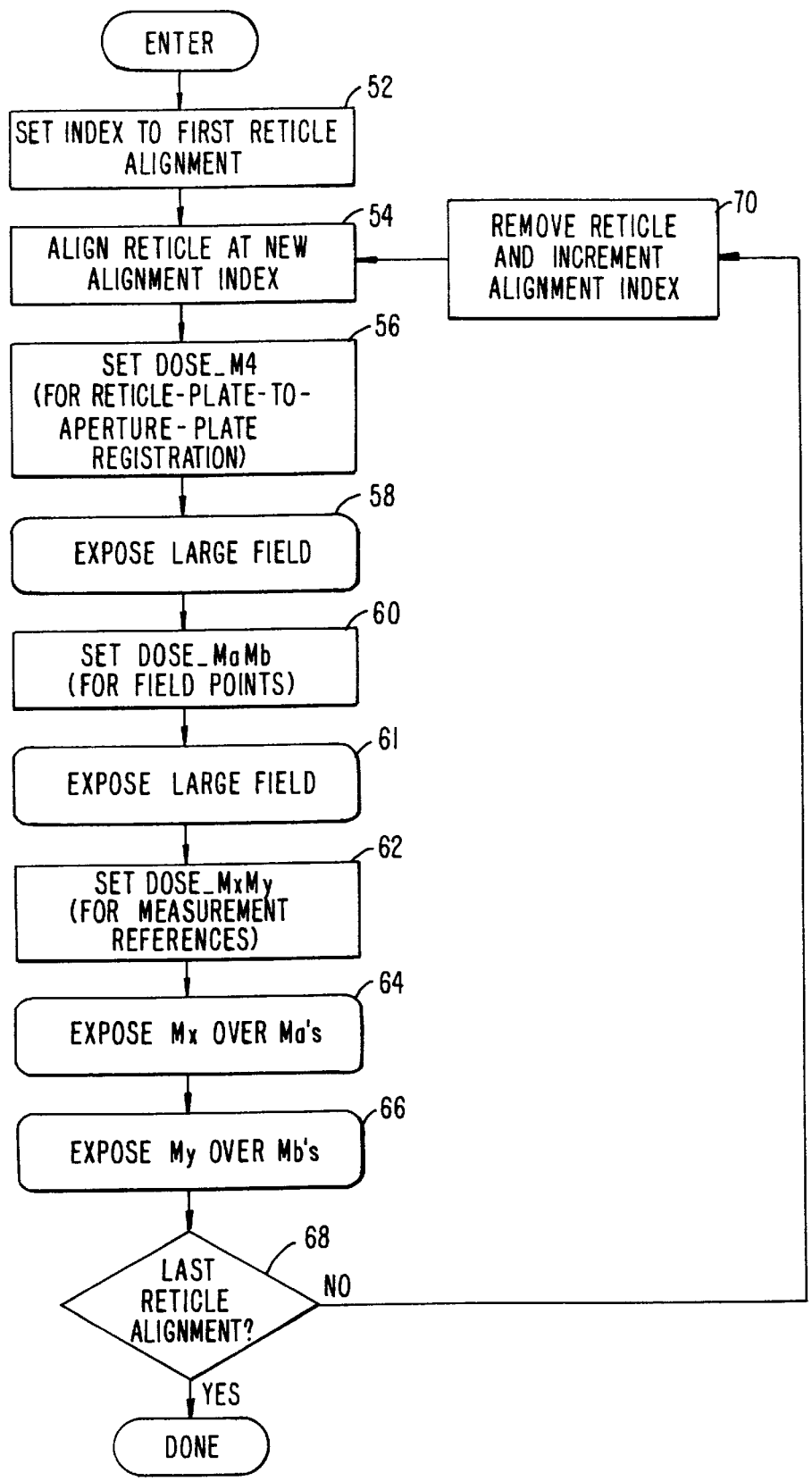
FIG. 12A is a computer schematic diagram of a stepper program for operating the in situ interferometer; and, FIG. 12B is a schematic outline for a program for expensing streets and alleys and corresponding reference squares.
Figure 12B:
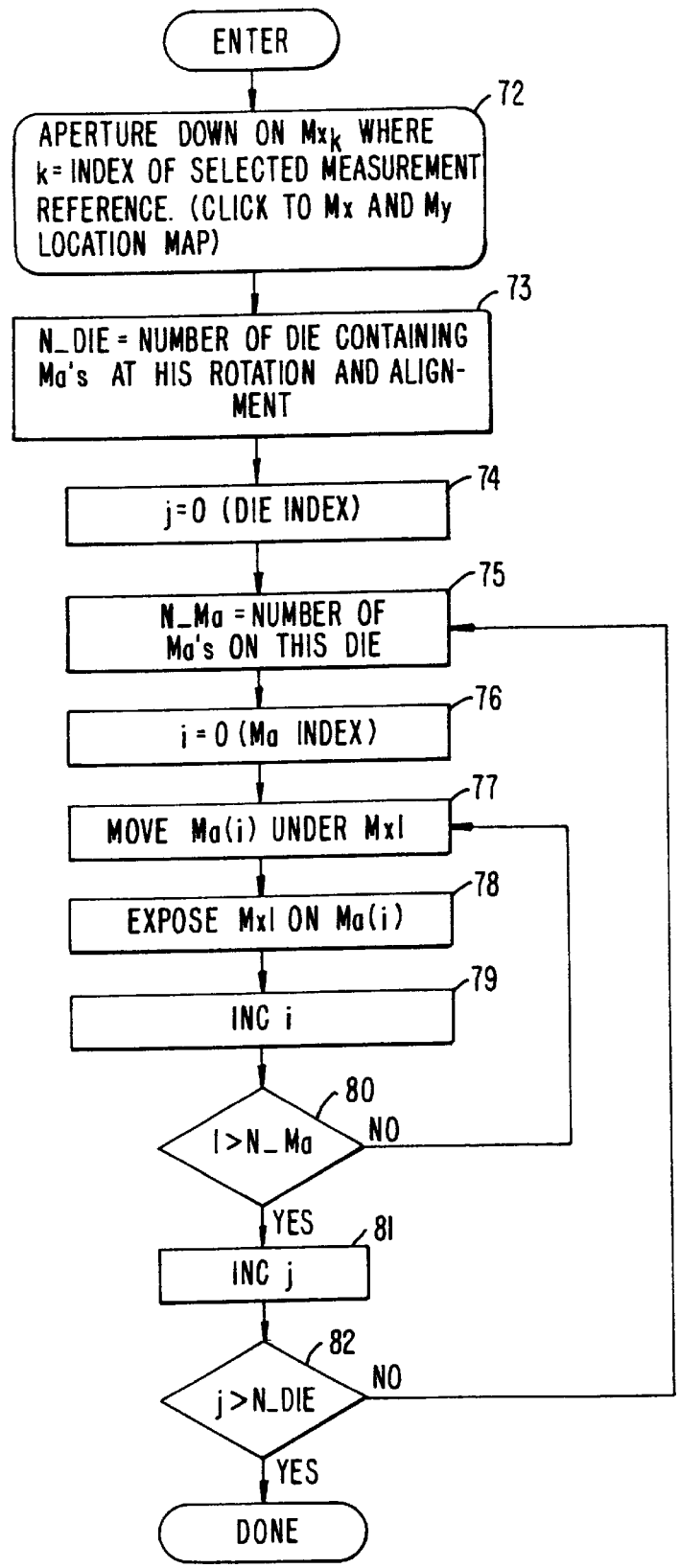

It is important to understand that the measurements taken from interferometer head I can be taken on an automated basis. Referring to FIGS. 12A and 12B, the schematic block diagram which can be programmed to the programmable operation of conventional stepper S is illustrated.

Referring to FIG. 12A, conventional stepper S is set to index to first reticle alignment 52. Alignment at new alignment index 54 occurs. Thereafter, exit pupil centering arrays M4 are exposed at set dose 56. Thus, an entire field is exposed on the wafer containing M4 arrays. Over an entire stepper field. (Step 58.) Thereafter, dose is set for MA-MB, 60, with exposure of this MA-MB field 61. Likewise, dose is set for MX-MY 62. Finally, exposure of MX over MA 64 and exposure of MY over MB 66. This leaves the data points similar to that illustrated in FIG. 11C.

This process is continually repeated over the possible alignment offsets of interferometer head I with indexing 70 until the last data point is reached. At this point, the loop of FIG. 12A terminates.

FIG. 12B describes in detail exposing the Mx's over the Ma's (step 64 in FIG. 12A). Aperture blades in a plane conjugate to the reticle plane in the stepper illumination system are apertured down so that only the particular Mix (square pattern) appropriate to the alignment offset is illuminated (step 72). Multiple die or fields are typically exposed, their number, N_die, is specified in box 73. Within each field or die, the Mx pattern is exposed on all of the sites where field point measurements are desired (steps 77–80). This sequence of steps is repeated over multiple die (steps 75–82).

Another embodiment of the exit pupil centering marks, M4,is illustrated in FIGS. 13a, b, c and 14a, b, c. FIG. 13a depicts (in the reticle plane) 4 CD (critical dimension) step structures (84, 85, 86, 87) centered around nominal exit pupil center 83. For use in positive photoresist the CD step structures are transparent in a dark chrome field. FIG. 14A is a close-up of step structure 84. Because of misalignments between the aperture plate and reticle plane and deviations in stepper side non-telecentricity from ideal, nominal exit pupil center 83 will not in general coincide with actual exit pupil center 83' of FIG. 13B. EP (FIG. 13B) outlines the actual exit pupil boundary as projected onto the reticle plane. It is shifted to the right relative to the features 84, 85, 86, and 87. When projected through the underlying aperture plate hole (not shown), exit pupil EP clips the features 84–87 to produce the corresponding images in the wafer plane 84'-87'. FIGS. 14b and 14c are enlargements of features 86" and 84". By measuring the number and widths or CD's (labeled CD1', CD1, CD2, CD3) in the projected wafer pattern of FIG. 13C, the size and offset of the exit pupil can be determined. This principle can be generalized to other structures that are clipped by the exit pupil that allow for measurement of exit pupil centration.

Another enhancement to the pupil centering measurements has lenses in the diffuser plane that nominally focus at the center of the aperture hole corresponding to an M4 or otherwise described exit pupil offset measurement structure. Other structures above the reticle for improving the quality of the projected structure include but are not limited to, glass beads or particles, deep or shallow 'frosted' or random structures, holographic or diffractive structures, or lenses or other refractive components in addition to random components.

As illustrated by FIG. 11C, CD measurements are made along with the box in box overlay measurements. These are necessary for correcting for CD variations in the reticle, and other illumination conditions. Additionally, the reported linewidths are used to provide offsets caused by diffraction (line asymmetry) of the aperture hole and the stepper aperture stop. These corrections are required for accurate work when using data points gathered anywhere near the edge of the exit pupil. Another correction that can be inferred from the linewidth or CD measurements are similar wave optic corrections the matrix elements of equation 3.

Another embodiment of this invention does not rely on optical overlay tools for generating data. In this version only the streets and alleys (the structures that pass through small holes in the aperture plate) are printed and at whatever density is required. A chrome and photoresist coated glass wafer is used and after exposure, is developed, the chrome etched, and the photoresist stripped. The resulting plate can then be vacuum contacted to and aligned with a corresponding, optically flat and similarly etched master reference plate. By aligning the plates to one another with a slight offset, and scanning the resulting grid pattern, the intensity of light transmitted through the two contacted glass pieces as a function of position can be measured and the resulting relative light gap opening thereby inferred. Other contact and noncontact interferometric methods of measuring the wafer to infer the aberration can also be conceived of by those skilled in the art.

The above invention has been described with specific reference to wafer steppers. It can be applied to reduction wafer steppers of 1:1 wafer steppers such as those manufactured by Ultratech. It can be applied to other optical systems such as step and scan or pure scanning systems as well. In fact any imaging optical instrument with an accessible image plane can be analyzed with this technique.

Thus far we have discussed measurement of effects of the interferometer head at the wafer plane through use of optical or interferometric metrology tools. Though not described in detail in this application there are electrical methods that one skilled in the art can conceive of to perform the required metrology to the extent that misalignments in the few to few hundred nanometer range impact the electrical performance of known devices, the present invention can be used to create such offsets in a printed wafer that are then interpreted as shifts. By creating electrical structure that exhibit asymmetry as of function of relative mispositioning a suitable processed and etched wafer could be integrated with a probe card and electrical test equipment and thereby produce measurements that are converted into the equivalent of the B box in a box or CD measurements herein described. Typically the measurement set for a single field point will utilize the additional steps of purposefully offsetting the wafer, by known amounts, from the nominal position one or more times. The purpose of said known transfere offsets is to calibrate the electrical measurement apparatus at the time and point of use. Most likely, this embodiment of the invention will utilize wafers that have been preprocessed in some form such as including precision structures and/or probe measuring points.

Such electrical structures include but are not limited to resistive or capacitive wheatstone bridges or asymmetry effects in transistor junction placement. Other examples of electrical structures and measurement techniques that can be used or used with modifications include "Electrical Methods for Precision Stepper Column Optimization" by L. Zych, G. Spadini, T. Hasan and B. Arden (SPIE Vo. 663, pg. 98, *Optical Microlithography V*, 1986).

What is claimed is:

1. A method for analysis of a lens train for taking an image from a reticle plane and relaying the image to a image plane, the method comprising the steps of:
   providing a reticle consisting of a multiplicity of separate and distinguishable points in the reticle plane;
   providing an aperture plate at a distance from the reticle having at least one opening;
   imaging at least a portion of the reticle through the at least one opening in the aperture plate to create a multiplicity of spots at the image plane, the multiplicity of spots having spot centroids relative to the separate and distinguishable points in the reticle deviated from diffraction limited positions by an average of grad($\phi(u)$) over the diffraction limited positions of the spots produced by a diffraction limited lens train and corresponding spots passing through the at least one opening.

2. A method for analysis of a lens train for taking an image from a reticle plane and relaying the image to a image plane according to claim 1, the method comprising the further steps of:
   the at least one opening in the aperture plate samples a discrete portion of the lens train only.

3. A method for analysis of a lens train for taking an image from a reticle plane and relaying the image to a image plane according to claim 1, the method comprising the further steps of:
   the multiplicity of separate and distinguishable points is spread out over an area of size 2*NAo*za with ray bundles having a chief rays covering the entire entrance pupil where NAo is the numerical aperture of the imaging objective on the object side and za is the separation between the aperture plate plane and the reticle plane.

4. A method for analysis of a lens train for taking an image from a reticle plane and relaying the image to a image plane according to claim 3, the method comprising the further steps of:
   the numerical aperture NAo is the aperture of the entrance pupil.

5. A method for analysis of a lens train for taking an image from a reticle plane and relaying the image to a image plane according to claim 1, the method comprising the further steps of:
   measuring the deviations of the centroids of the multiplicity of spots from their diffraction limited positions to obtain the average values of grad($\phi(u)$) sampled over the entrance pupil.

6. A method for analysis of a lens train for taking an image from a reticle plane and relaying the image to a image plane according to claim 5, the method comprising the further steps of:
   reconstructing an aberrated wavefront corresponding to the multiplicity of points in the reticle plane that passed through the at least one opening in the aperture plate.

7. A method for analysis of a lens train for taking an image from a reticle plane and relaying the image to a image plane according to claim 6, the method comprising the further steps of:
   identifying the reconstructed wavefront $\phi(u)$ with a single field point position (x,y).

8. A method for analysis of a lens train for taking an image from a reticle plane and relaying the image to a image plane according to claim 1, the method comprising the further steps of:
   analyzing the wavefront at a multiplicity of openings in the aperture plate over the entire lens train with each opening is centered underneath a neighborhood of points that is accepted into an entrance pupil of the imaging objective.

9. A method for analysis of a lens train for taking an image from a reticle plane and relaying the image to a image plane according to claim 8, the method comprising the further steps of:
   utilizing the totality of all the arrays of spots whose centroids can be measured and reconstructed to yield an aberrated wavefront $\phi(u;x)$ at a number of discrete field points x.

10. An in situ interferometer for insertion to a reticle plane of a stepper for transmitting through lenses of the stepper and printing to a wafer plane of the stepper interferometry data comprising in combination:

a housing for insertion to the reticle plane of the stepper;

means defining at least one aperture attached to the housing for passing a bundle of diverging rays through the aperture;

an aperture lens overlying and corresponding to the aperture attached to the housing, the aperture lens for focusing light of the stepper to the aperture for transmitting light through the aperture to the lenses of the stepper for projection to the wafer plane of the stepper; and, a first reticle having a pattern between the aperture lens and aperture for imparting to the focusing light from the aperture lens the pattern for printing at the wafer plane of the stepper.

11. An in situ interferometer for insertion to a reticle plane of a stepper according to claim 10 and further comprising:

means defining at least one second aperture attached to the housing for passing a bundle of diverging rays through the stepper;

a second reticle having a pattern for projection through the second aperture for imparting to transmitted light image information relating to telecentricity of the stepper.

12. An in situ interferometer for insertion to a reticle plane of a stepper according to claim 10 and further comprising:

a third reticle having a pattern for projection through the lenses of the stepper for forming regular images at the wafer plane of the stepper, the third reticle having an images size and distribution related to the first reticle to enable optical data to be ascertained from relative positions of image information from the first reticle relative to the third reticle.

13. An in situ interferometer for insertion to a reticle plane of a stepper according to claim 12 and further comprising:

the third reticle having a pattern for projection of through the lenses of the stepper includes a pattern of squares; and, the first reticle having a pattern has a pattern of streets and alleys for projecting about the pattern of squares to enable placement of the squares relative to the streets and alleys to impart optical information at least about distortion and curvature of field of the stepper.

14. A method for in situ interferometric measurement of a stepper comprising the steps of:

providing a housing for insertion to a reticle plane of the stepper, the housing including, means defining at least one an aperture attached to the housing for passing a bundle of diverging rays through the aperture;

an aperture lens overlying the aperture attached to the housing, the aperture lens for focusing light of the stepper to the aperture for transmitting light through the aperture to lenses of the stepper for projection to a wafer plane of the stepper; and, a first reticle having a pattern between the aperture lens and aperture for imparting to transmitted light image the pattern for printing at the wafer plane of the stepper;

providing at the wafer plane of the stepper a regular pattern of images;

projecting the pattern from the reticle plane by imaging light on the aperture lens to have the pattern of the first reticle project about the regular pattern of images to enable relative projected placement of the pattern from the reticle plane relative to the regular pattern of images to indicate optical data related to at least distortion and curvature of field of the stepper.

15. The method for in situ interferometric measurement of a stepper according to claim 14 and wherein the step of providing at the wafer plane of the stepper a regular pattern of images includes:

generating a regular pattern of images independently of the stepper.

16. The method for in situ interferometric measurement of a stepper according to claim 14 and wherein the step of providing at the wafer plane of the stepper a regular pattern of images includes:

generating the regular pattern of images by projecting the images through the stepper.

17. The method for in situ interferometric measurement of a stepper according to claim 14 and wherein the step of providing at the wafer plane of the stepper a regular pattern of images includes:

generating the regular pattern of images by projecting a segment of the pattern of images through the stepper and stepping and repeating the segment of the pattern to generate the pattern of images.

18. The method for in situ interferometric measurement of a stepper according to claim 14 and including the further steps of:

defining at least one second aperture attached to the housing for passing a bundle of diverging rays through the stepper;

providing a second reticle having a pattern for projection through the second aperture for imparting to transmitted light image information relating to telecentricity of the stepper;

projecting the second reticle through the at least one second aperture to provide optical data relating to the telecentricity of the stepper.

19. The method for in situ interferometric measurement of a stepper according to claim 14 and including the further steps of:

providing at the wafer plane of the stepper a regular pattern of images includes providing a regular pattern of squares; and, providing the first reticle having a pattern with a pattern of streets and alleys for bounding the regular pattern of squares to impart to spatial separation between the pattern of streets and alleys and the regular pattern of squares, the spatial separation containing optical data.

* * * * *